(12) United States Patent
Aleksov et al.

(10) Patent No.: US 11,264,373 B2
(45) Date of Patent: Mar. 1, 2022

(54) DIE BACKEND DIODES FOR ELECTROSTATIC DISCHARGE (ESD) PROTECTION

(71) Applicant: Intel Corporation, Santa Clara, CA (US)

(72) Inventors: Aleksandar Aleksov, Chandler, AZ (US); Adel A. Elsherbini, Chandler, AZ (US); Feras Eid, Chandler, AZ (US); Veronica Aleman Strong, Hillsboro, OR (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 16/724,259

(22) Filed: Dec. 21, 2019

(65) Prior Publication Data
US 2021/0193645 A1 Jun. 24, 2021

(51) Int. Cl.
| | |
|---|---|
| *H01L 27/02* | (2006.01) |
| *H01L 23/528* | (2006.01) |
| *H01L 29/24* | (2006.01) |
| *H01L 29/861* | (2006.01) |
| *H01L 29/47* | (2006.01) |
| *H01L 29/872* | (2006.01) |
| *H01L 29/45* | (2006.01) |

(52) U.S. Cl.
CPC ...... *H01L 27/0255* (2013.01); *H01L 23/5286* (2013.01); *H01L 27/0248* (2013.01); *H01L 29/24* (2013.01); *H01L 29/45* (2013.01); *H01L 29/47* (2013.01); *H01L 29/8613* (2013.01); *H01L 29/872* (2013.01)

(58) Field of Classification Search
CPC . H01L 27/0255; H01L 27/0248; H01L 29/24; H01L 29/45; H01L 29/8613; H01L 29/47; H01L 23/5286; H01L 29/872
See application file for complete search history.

(56) References Cited

U.S. PATENT DOCUMENTS

| | | | | |
|---|---|---|---|---|
| 5,644,167 | A * | 7/1997 | Weiler | H01L 23/60 257/203 |
| 2004/0119159 | A1* | 6/2004 | Takahashi | H05K 1/0259 257/723 |
| 2006/0198070 | A1* | 9/2006 | Marr | H01L 27/0255 361/56 |
| 2009/0020844 | A1* | 1/2009 | Park | H01L 27/0255 257/476 |
| 2014/0367700 | A1* | 12/2014 | Prechtl | H01L 29/778 257/77 |

(Continued)

OTHER PUBLICATIONS

Paul Gray et al., Analysis and Design of Analog Integrated Circuits, ISBN 978-0-470-24599-6, Wiley & Sons, Fifth Edition, Chapter 1, pp. 6-8, 2009. (Year: 2009).*

(Continued)

*Primary Examiner* — S M Sohel Imtiaz
(74) *Attorney, Agent, or Firm* — Patent Capital Group

(57) ABSTRACT

Embodiments may relate to a die with a front-end and a backend. The front-end may include a transistor. The back-end may include a signal line, a conductive line, and a diode that is communicatively coupled with the signal line and the conductive line. Other embodiments may be described or claimed.

12 Claims, 18 Drawing Sheets

(56) References Cited

U.S. PATENT DOCUMENTS

| | | | |
|---|---|---|---|
| 2016/0071833 A1* | 3/2016 | Russ | H01L 27/0274 257/355 |
| 2018/0269197 A1* | 9/2018 | Balakrishnan | H01L 29/66136 |
| 2019/0341373 A1* | 11/2019 | Yu | H01L 23/3121 |
| 2020/0287060 A1* | 9/2020 | Arima | H01L 29/8725 |
| 2021/0193644 A1 | 6/2021 | Aleksov et al. | |

OTHER PUBLICATIONS

Alan Hastings, The art of Analog Layout, ISBN 0-13-087061-7, Prentice Hall, pp. 10-15, 2001. (Year: 2001).*

* cited by examiner

DIE BACKEND DIODES FOR ELECTROSTATIC DISCHARGE (ESD) PROTECTION

BACKGROUND

One concern for microelectronic packages, or components thereof, is electrostatic discharge (ESD). ESD may refer to a sudden onset of charge transfer (i.e., electron flow) between two objects with different electric potentials. These static voltages may cause partial to full breakdown of an integrated circuit (IC) or another component of the microelectronic package.

DETAILED DESCRIPTION

Figure 1:
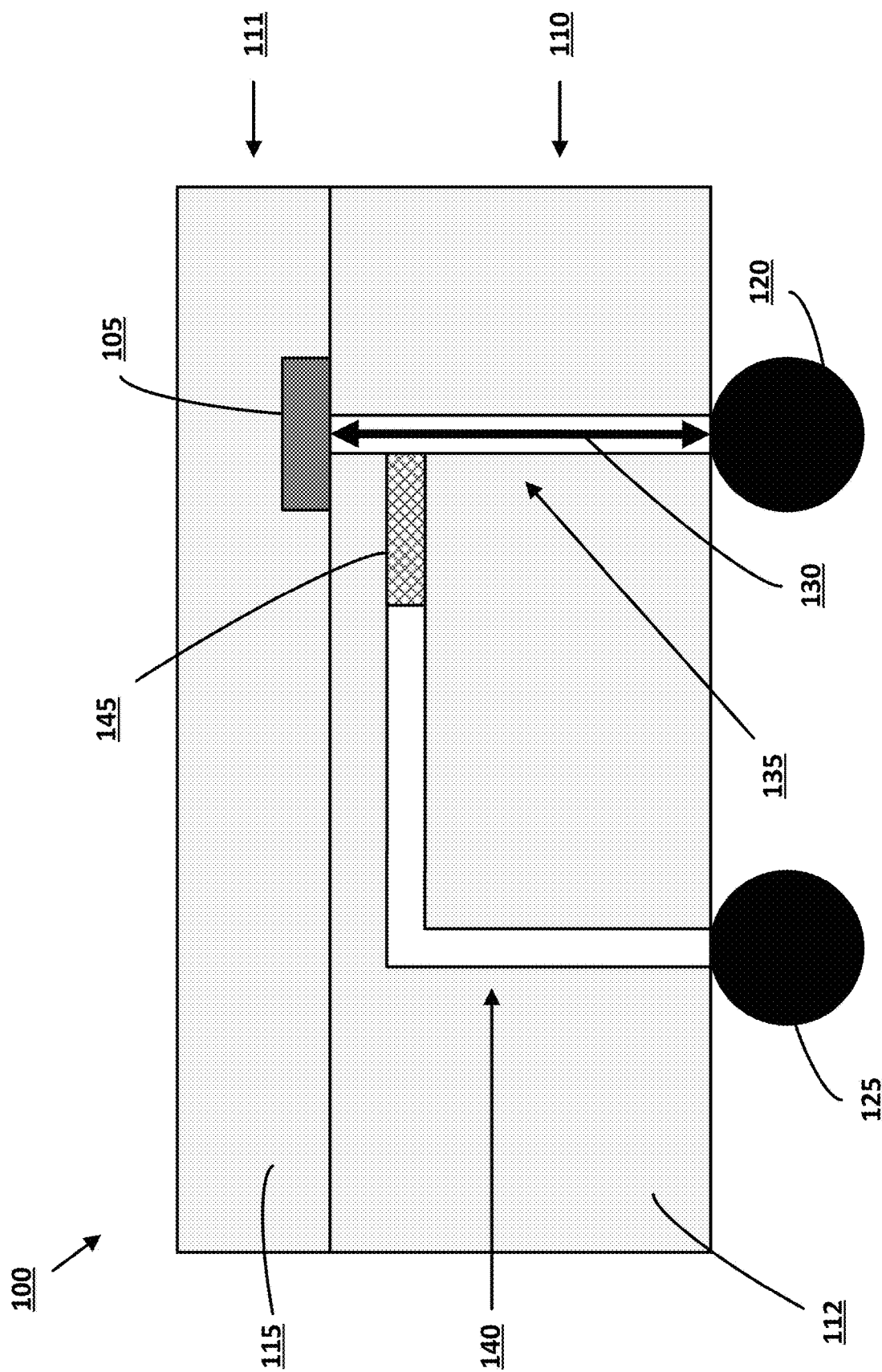
FIGS. 1 and 2 depict an example die with a diode-based ESD protection structure, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

It will be understood that the term "microelectronic package" may, in other situations, be referred to as a "semiconductor package." However, the term "microelectronic package" will be used herein for the sake of consistency.

As noted, ESD events may lead to partial to full breakdown of an IC or other component of the microelectronic package. For example, when IC chips come into contact with bodies at a different potential (e.g., human workers or manufacturing equipment) during assembly or handling, they can experience a fast transfer of a large amount of electrostatic discharge that can cause electric-field induced breakdown and thermal degradation of the devices in those chips. Therefore, including ESD protection features in those hips may be desirable for achieving and maintaining a high yield.

In legacy dies or microelectronic packages, ESD protection may have been achieved by fabricating and using silicon-based pn-junction diodes in the front-end of the dies. The diodes may have been configured to shunt large ESD signals to ground. However, this approach may use valuable silicon real estate that could otherwise be used for logic. With an ever-increasing number of signal lines, this silicon real estate dedicated to ESD may increase. For example, some legacy packages may use two diodes per signal line.

The diodes in the front-end may have been designed such that their forward bias voltage is just below the threshold value at which the functional devices in the die (e.g., transistors) start getting damaged. When an external voltage greater than or equal to this value is applied at the exposed port of the die, the diode is forward biased and may shunt the high voltage input to ground, shielding the devices. When a normal voltage (below the threshold value) is applied at the input port, the diode may act as a capacitor between the port and ground, and the signal may be transmitted to the active devices of the die for processing. In some embodiments the described diode may, in reality, be a number of diodes (e.g., 60-100) in an array, which may add complexity and require a large die-area for implementation.

Another issue with the legacy solution may occur when silicon-on-insulator (SOI) technology or technology where the devices are manufactured on a semiconductor or silicon layer that is insulated from bulk silicon (possible due to other dielectric structures on the top and bottom of the device layer). In this case, lateral pn-junctions may be used that may add some additional area to the ESD solution, taking it away from the available area for the active circuits.

By contrast, embodiments herein relate to the integration of ESD protection features in the backend of the die (which may also be referred to as the "interconnect stack" of the die). This integration may allow a reduction in the number of silicon front-end ESD diodes, and offloading of ESD protection features into the interconnect stack.

The diodes may be Schottky or pn-junction diodes that use materials compatible with backend processing. For example, the diodes may be based on oxide-based or organic-based semiconductor materials, or a combination thereof. Example oxide-based semiconductor materials may include gallium oxide ($Ga_2O3$), indium oxide ($In_2O_3$), indium gallium zinc oxide (IGZO), or zinc oxide ($ZnO_2$). Example organic-based semiconductor materials may include copper phthalocyanine (CuPc), titanium phthalocyanine (TiPc), copper hexadecafluorophthalocyanine ($F_{16}$CuPc), titanium hexadecafluorophthalocyanine ($F_{16}$TiPc), poly(3-hexylthiophene) (P3HT), Hexaazatriphenylenehexacarbonitrile (HAT-CN), 2,3,5,6-Tetrafluoro-7,7,8,8-tetracyanoquinodimethane (F4TCNQ), or rubrene. However, it will be understood that this list of materials is not intended as an exhaustive list and other oxide-based or organic-based semiconductor materials may be present in other embodiments.

The above-listed semiconductor materials may exhibit a strong preference for doping (i.e., are either easily n-doped or p-doped, but not the other way around), so may lend themselves towards use as a Schottky diode. As used herein, a Schottky diode may refer to a semiconductor diode formed by the junction of a semiconductor material (e.g., the above-listed organic-based or oxide-based semiconductor materials) with a metal. Because many of the above-mentioned semiconductor materials, particularly the oxide-based semiconductor materials, have a significantly wider band-gap (i.e., energy level required for the semiconductor material to become conductive) than silicon, creating Schottky diodes with a barrier height (i.e., the potential energy barrier for electronics formed at a metal-semiconductor junction) that is identical to the built-in voltage of a pn-junction diode may be possible.

Schottky diodes may be referred to herein as "n-doped" or "p-doped" (or, similarly, n-type or p-type). As used herein, an n-doped Schottky diode may refer to a Schottky diode with a semiconductor material that includes a dopant such as antimony, arsenic, phosphorous, or some other pentavalent dopant. In an n-doped Schottky diode, current may flow from the Schottky contact to the semiconductor material. By contrast, a p-doped Schottky diode may refer to a Schottky diode with a semiconductor material that includes a dopant such as boron, aluminum, or gallium. In a p-doped Schottky diode, current may flow from the semiconductor material to the Schottky contact.

The use of Schottky diodes may also provide a variety of benefits. One such benefit is that Schottky diodes may be simpler to manufacture, as only one semiconductor conductivity type is required (rather than, for example, a pn-junction diode that requires at least two semiconductor materials). An additional advantage is that the reaction time of a Schottky diode, and their associated speed, may be much higher than for pn-junction diodes because Schottky diodes are majority carrier devices.

Embodiments herein may provide a variety of additional advantages. For example, embodiments may allow for off-loading of ESD protection from the active front-end of the die to the backend/interconnect stack, and thus free up valuable die front-end space. Additionally, embodiments may provide an additional level of protection which may provide valuable robustness for dies or microelectronic packages in environments where an ESD event is highly likely.

Figure 2:
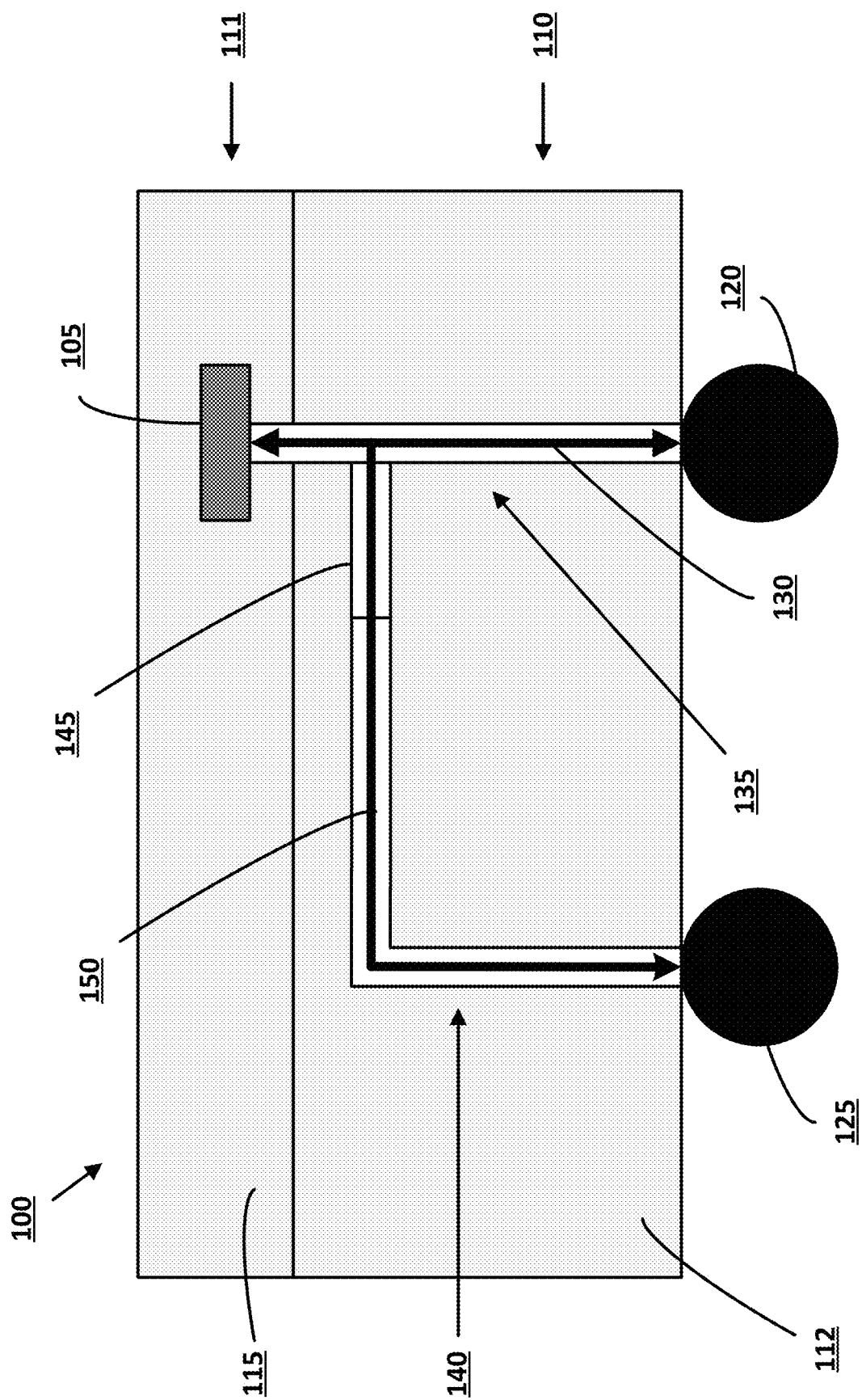

FIGS. 1 and 2 depict an example die 100 with an ESD protection structure 145, in accordance with various embodiments. The die 100 may include a front-end 111 and a backend 110. The front-end 111 may include one or more ICs 105. The ICs 105 may be or include a transistor or some other circuitry. The backend 110 may include one or more conductive elements as will be discussed in further detail with reference to other Figures. Generally, the conductive elements may include one or more conductive traces, pads, vias, microstrips, striplines, or some other conductive elements that allow for, or facilitate, communication between the IC 105 and other elements of the die 100, or other elements of an electronic device to which the die 100 is coupled. Although not explicitly shown for the sake of lack of clutter of the Figure, either the front-end 111 or the backend 110 may include additional conductive elements, passive elements such as resistors, inductors, capacitors, etc. Likewise, the front-end 111 may include additional ICs which may be similar to IC 105. The front-end 111 may be formed out of, or may include, a front-end material 115 such as silicon (Si), silicon-germanium (SiGe), gallium arsenide (GaAs), gallium nitride (GaN), indium phosphate (InP) or a combination of different semiconductor materials used for IC/transistor fabrication as listed above. Similarly, the backend 110 may be formed out of, or may include, a backend material 112 such as commonly used inter-layer dielectric (ILD) materials, silicon dioxide ($SiO_2$), Low-K ILD dielectric materials e.g. carbon-doped $SiO_2$, silicon nitride ($Si_3N_4$), etc. The backend may be made of many interconnect layers each having a different ILD material. Each interconnect layer may include a metal layer which may be copper (Cu), aluminum (Al), gold (Au), etc.

The die 100 may be or include, for example as IC 105, a processor such as a central processing unit (CPU), general processing unit, a core of a distributed processor, or some other type of processor. Alternatively, the die 100 may be or include a memory such as a double data rate (DDR) memory, a nonvolatile memory (NVM), a volatile memory, a read-only memory (ROM), or some other type of memory or die. In some embodiments the die 100 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal.

The die 100 may further include a plurality of interconnects such as interconnects 120 and 125. The interconnects 120 and 125 may be formed of a material such as tin, copper, silver, etc., and may be elements of a ball grid array (BGA), pin grid array (PGA), land grid array (LGA), etc. The interconnects 120/125 may communicatively or physically couple the die 100 to another element of an electronic device such as a printed circuit board (PCB), a motherboard, an interposer, etc.

More specifically, the interconnect 120 may communicatively couple the die 100 with a voltage input. The voltage input may be, for example, a power source, a communicative pathway (e.g., a signal line or a power line), or some other element of an electronic device to which the die 100 is coupled or of which the die 100 is a part. Specifically, the voltage input may provide an electrical signal 130 with an input voltage $V_{in}$. The interconnect 125 may communicatively couple the die 100 with a ground. The ground may be, for example, a ground plane of the electronic device, a ground plane or ground connection of a microelectronic package of which the die 100 is a part, or some other ground.

As noted above, the backend 110 of the die 100 may include a number of conductive elements such as vias, traces, microstrips, striplines, pads, etc. The conductive elements may form a number of signal/electronic pathways through the backend 110. One such pathway is signal path 135. The signal path 135 may allow for the electrical signal 130 to travel between the interconnect 120 and the IC 105. The electrical signal 130 may be, for example, a data signal or some other type of electrical signal.

It will be noted that although IC 105 is depicted as in a portion of the front-end 111 that is directly adjacent the backend 110, and the signal path 135 is depicted as ending at the backend 110, in some embodiments the IC 105 may be in a portion of the front-end 111 that is not directly adjacent the backend 110. In this embodiment, the signal path 135 may include one or more conductive elements in the front-end 111 and at least partially extend into the front-end 111 to communicatively couple the interconnect 120 to the IC 105.

The backend 110 may further include a ground path 140. The ground path 140 may be coupled with the interconnect 125 and, through interconnect 125, to ground. In some embodiments, the ground path 140 may be referred to as a "shunt" to ground.

The ground path 140 and the signal path 135 may be communicatively coupled by an ESD protection structure 145. As can be seen, the ESD protection structure 145 may be communicatively located between the ground path 140 and the signal path 135. The specific makeup of the ESD protection structure 145 may be discussed in greater detail below, however, at a high level the ESD protection structure 145 may behave as an insulator at low voltages, and be conductive at relatively high voltages. Specifically, the ESD protection structure 145 may have a voltage threshold referred to herein as $+V_{trigger}$. If $V_{in}$ is below (or, in some embodiments, at or below) $+V_{trigger}$, then the ESD protection structure 145 may be insulative and not allow electrical signals to flow between the signal path 135 and the interconnect 125. An example of such an insulative state is shown in FIG. 1.

However, if $V_{in}$ is above (or, in some embodiments, at or above) $+V_{trigger}$, then the ESD protection structure 145 may switch to a conductive state. An example of such a conductive state is shown in FIG. 2. Specifically, at least a portion of the electrical signal 130 may still traverse through the signal path 135. However, a portion 150 of the electrical signal may also be shunted to ground through the ground path 140.

In operation, $+V_{trigger}$ may be set to a level that is above the level at which a data or power signal may desirably traverse along the signal path 135. However, it may also be desirable for $+V_{trigger}$ to be at a level that is below a voltage level at which IC 105 may become damaged. More specifically, it may be desirable for $+V_{trigger}$ to be at a level that is below the voltage level which may be present in an ESD event. As such, if ESD occurs, then $V_{in}$ may become greater than (or equal to, in some embodiments) $+V_{trigger}$, and so the ESD protection structure 145 may become conductive and at least a portion of the voltage from the ESD may shunt to ground through the ground path 140. However, if there is no ESD event, then $V_{in}$ may be below (or equal to, in some embodiments) $+V_{trigger}$ and so electrical communication along the signal path 135 may occur as normal.

Generally, it may be desirable for $+V_{trigger}$ to be less than or equal to a few volts (e.g. between approximately 2 and approximately 10 volts (V), or more specifically between approximately 4 and approximately 5 V.) However, it will be understood that these are example ranges and the $+V_{trigger}$ level of other embodiments may vary. Such variation may be based on, for example, the specific use case to which the die 100 may be put, specific properties of the IC 105, or other material or design considerations. More specifically, +$V_{trigger}$ may be based on or derived from the specific structure of the ESD protection structure.

The example of FIGS. 1 and 2 are described above with respect to +$V_{trigger}$ being a positive value, and the ESD event occurring when $V_{in}$ is greater than +$V_{trigger}$. In this situation, a shunt of excess current from the signal path 135 may shunt to ground through the ground path 140, as depicted in FIG. 2. This excess current may shunt to ground because the voltage of the signal path 135 may be greater than that of ground, and so the current may flow from the higher voltage to the lower voltage along the ground path 140. However, it will be understood that a significant negative voltage swing may likewise cause damage to the IC 105. As such, in some embodiments it may be desirable for the ESD protection structure 145 to likewise have a negative threshold voltage –$V_{trigger}$ which may help to protect against negative swings in the voltage Vim In this embodiment, if $V_{in}$ is at or below –$V_{trigger}$, then current may flow from the ground path 140 into the signal path 135. The specific values or configuration of the ESD protection structure 145, specifically with respect to the existence of, or values of, +$V_{trigger}$ or –$V_{trigger}$, may be based on design-related factors or the specific use case to which the die 100 may be put. Various examples of use cases related to threshold voltages may be described in greater detail below with respect to other embodiments herein.

Additionally, with respect to the signs of the various voltages, the examples described herein are based on the assumption that ground is equal to approximately 0 V. However, in some embodiments "ground" may be kept at a constant positive or negative voltage, and so the specific values of voltages such as +$V_{trigger}$, –$V_{trigger}$, etc. may be considered to be with respect to the value of ground. In other words, in some embodiments –$V_{trigger}$ may be a positive voltage, or +$V_{trigger}$ may be a negative voltage, dependent on the voltage at which ground is held.

The above-described FIGS. 1 and 2 are intended as examples, and other embodiments may vary with respect to number of elements, specific configurations, etc. For example, it will be understood that the signal path 135 and the ground path 140 are highly simplified examples, and other embodiments may include additional conductive elements such as pads, traces, etc. Similarly, the relative sizes, shapes, or number of the paths, the dies, the interconnects, etc. may be different in other embodiments. For example, some embodiments may have additional ICs 105, additional interconnects 120/125, additional signal paths 135 or ground paths 140, additional ESD protection structures 145, etc., or one or more of those elements in a location that is different than the location depicted in FIG. 1 or 2. Other variations may be present in other embodiments.

Various Figures herein (e.g. FIGS. 3-8, 13-17, etc.) illustrate embodiments wherein an ESD protection structure (e.g., ESD protection structure 145) includes a Schottky diode in the backend of a die such as backend 110 of die 100. It will be understood that various Figures may refer only to the backend for the sake of clarity and focus of the Figure, but in real-world embodiments the depicted backend may be part of a die such as die 100 that includes both a front-end 111 and a backend 110.

Figure 3:
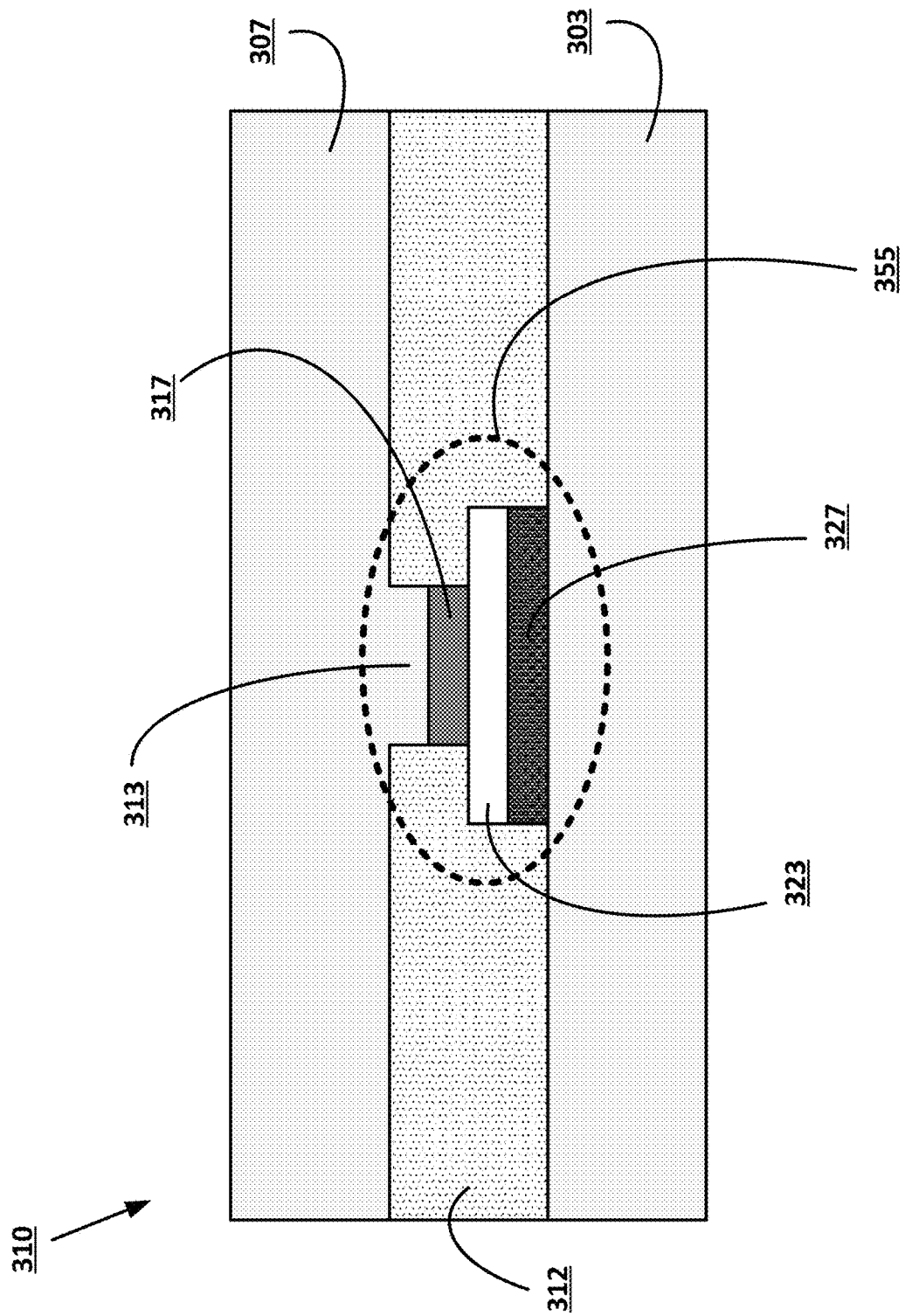
FIG. 3 depicts a simplified cross-sectional view of a die backend with a diode-based ESD protection structure, in accordance with various embodiments.
Figure 4:
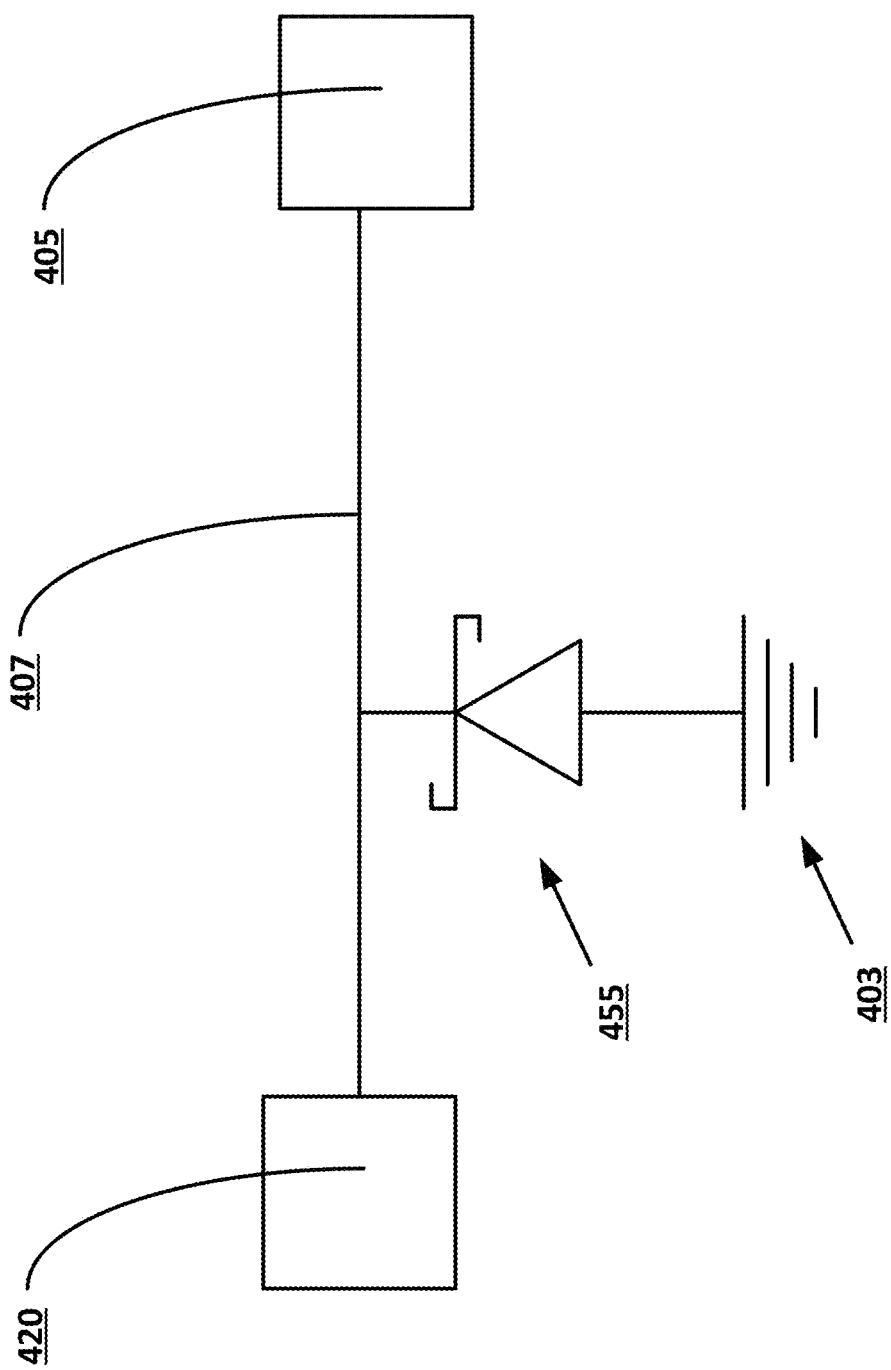
FIG. 4 depicts a simplified circuit diagram of the diode-based ESD protection structure of FIG. 3, in accordance with various embodiments.

FIGS. 3 and 4 depict a single-sided ESD protection wherein the Schottky diode may shunt the signal line against a ground line or plane that is adjacent to the signal line. Specifically, FIG. 3 depicts a simplified cross-sectional view of a backend 310 with a diode-based ESD protection structure, in accordance with various embodiments. The backend 310 may be similar to, and share one or more characteristics with, backend 110. The backend 310 may include a backend material 312 which may be similar to, and share one or more characteristics with, backend material 112. Although the backend 310 is depicted as only including two conductive layers with a backend material 312 therebetween, in other embodiments the backend may have significantly more layers than depicted, for example on the order of 4-32 layers.

The backend 310 may include a signal line 307 and a ground line 303. The signal and ground lines 307 and 303 may be or may include, for example, conductive elements such as a trace, a microstrip, a stripline, a via, a pad, etc. The signal and ground lines 307 and 303 may be formed of a conductive material such as copper, gold, or some other conductive material. The signal line 307 may be an element of a signal path such as signal path 135. Specifically, the signal line 307 may be communicatively coupled to, and convey data signals to or from, an IC of a front-end of the die such as IC 105. In some embodiments the signal line 307 may be referred to as an input/output (I/O) line. The ground line 303 may be an element of a ground path such as ground path 140. In some embodiments, the ground line 303 may be one of the conductive elements described above. In other embodiments, the ground line 303 may be a ground plane (e.g., a sheet of a conductive material that takes up a substantial portion of the layer of the backend 310 in which its positioned).

The backend 310 may further include a diode 355, which may act as an ESD protection structure such as ESD protection structure 145 described above. Specifically, the diode 355 may be a Schottky diode that includes a Schottky contact 317, a semiconductor material 323, and an ohmic contact 327. The semiconductor material 323 may be an organic-based or an oxide-based semiconductor material as described above. Specifically, the semiconductor material 323 may be, or may be some combination of, $Ga_2O3$, $In_2O_3$, IGZO, $ZnO_2$, CuPc, TiPc, $F_{16}$CuPc, $F_{16}$CuPc, P3HT, HAT-CN, F4TCNQ, rubrene, or some other appropriate organic-based or oxide-based semiconductor material.

The Schottky contact 317 may be a metal material such as molybdenum, platinum, chromium, tungsten, or a silicide such as palladium silicide or platinum silicide. More specifically, if the semiconductor material 323 is, for example, IGZO, then it may be desirable for the Schottky contact 317 to be or include palladium (Pd), titanium nitride (TiN), gold (Au), platinum (Pt), etc. (or some combination thereof). As another example, if the semiconductor material 323 is $Ga_2O_3$, it may be desirable for the Schottky contact 317 to be or include nickel (Ni), Pt, Pd, Au, etc. (or some combination thereof).

As can be seen in FIG. 3, the Schottky contact 317 may be positioned directly adjacent to the semiconductor material 323, which may form a Schottky barrier. As noted above, the Schottky barrier may be a potential energy barrier for electrons formed at the junction of the Schottky contact 317 and the semiconductor material 323. The potential energy barrier may be a $V_{trigger}$ such as +$V_{trigger}$ or –$V_{trigger}$ as described above. Once the voltage $V_{in}$ becomes greater than (or equal to) +$V_{trigger}$ (or less than or equal to –$V_{trigger}$), then the diode 355 may become conductive and allow current to flow through the diode between, for example, the signal line 307 and the ground line 303. Generally, a Schottky diode may be referred to as "forward-rectified" which means that current may generally only flow in a single direction through the diode 355, e.g. from the signal line 307 to the ground line 303 if the semiconductor material 323 is n-doped, or from the ground line 303 to the signal line 307 if the semiconductor material 323 is p-doped, but not vice-versa.

The ohmic contact 327 may be a non-rectified contact which allows current to flow in both directions through it. Generally, the ohmic contact 327 may be a material such as aluminum (Al), aluminum-silicon (Al—Si), titanium disulfide (TiS$_2$), TiN, tungsten (W), molybdenum disilicide (MoSi$_2$), platinum silicide (PtSi), cobalt silicide (CoSi$_2$), tungsten silicide (WSi$_2$), or some other appropriate material. For example, if the semiconductor material 323 is IGZO, then it may be desirable for the ohmic contact 327 to be or include Mo, Cu, Al, Ti, Au, etc. (or some combination thereof). As another example, if the semiconductor material 323 is Ga$_2$O$_3$, then it may be desirable for the ohmic contact 327 to be or include Ti, Au, etc. (or some combination thereof).

As can be seen, the Schottky contact 317 and the semiconductor material 323 may form a Schottky barrier as described above. A trace protrusion 313 may be an element of, or coupled to, the signal line 307, and may communicatively couple the signal line 307 to the Schottky contact. In this manner, current may flow between the signal line 307 and the Schottky contact 317 through the trace protrusion.

It will be understood that the particular embodiment depicted in FIG. 3 is intended as an example embodiment, and other embodiments may vary in one or more respects. For example, in some embodiments the trace protrusion 313 may not be present, and rather the Schottky contact 317 may directly abut the signal line 307. In some embodiments the signal line 307 may be below the ground line 303 rather than above it as depicted in FIG. 3. In some embodiments, the signal line 307 or the trace protrusion 313 may be formed of a material which may be appropriate for use as a Schottky contact, and therefore the additional Schottky contact 317 may not be present. Similarly, in some embodiments the ohmic contact 327 may not be present, as the material used for the ground line 303 may be appropriate for use as an ohmic contact. In other embodiments, dependent on the type of doping (n-doped or p-doped) of the semiconductor material 323, and hence the resultant conductivity, the Schottky contact 317 may be coupled with the ground line 303, and the ohmic contact 327 may be coupled with the signal line 307. Other factors that may affect the specific configuration of the diode 355 may include manufacturing or circuit-design considerations. It will be noted that other variations may be present in other embodiments. For example, the relative sizes, shapes, etc. of various elements of the Figure may be different in different embodiments. For example, in some embodiments the Schottky contact 317 may be generally the same lateral size as the semiconductor material 323 or the ohmic contact 327. In some embodiments, even though the ESD protection structure is described as being internal to the backend 310, the signal line 307 or the ground line 303 may be an outer-layer of the backend 310 or in the front-end of the die. In some embodiments the signal line 307 and the ground line 303 may be perpendicular to one another rather than parallel, or at some other angle with respect to one another.

FIG. 4 depicts a simplified circuit diagram of the diode-based ESD protection structure of FIG. 3, in accordance with various embodiments. The circuit may be an element of a die backend such as backend 310. The circuit may include a connection to a signal input such as interconnect 420. The interconnect 420 may be similar to, and share one or more characteristics with, interconnect 120 and may provide a connection between the circuit and a signal input. The interconnect 420 may be coupled with a signal line 407 which may be similar to, and share one or more characteristics with, signal line 307. The circuit may also include a connection to ground 403, which may be similar to, and share one or more characteristics with, ground 303. A diode 455, which may be similar to, and share one or more characteristics with, diode 355 may be positioned between the ground 403 and the signal line 407. The circuit may also include a connection 405 to an IC such as IC 105. In some the connection 405 may be the IC itself. In other embodiments, the connection 405 may be a connection in the backend (e.g., backend 310) to the front-end (for example, front-end 111) of the die and the IC of the front-end. The specific location of element 405 in the chip is generally beyond the scope of the simplified circuit diagram of FIG. 4.

In the specific embodiment of FIGS. 3 and 4, is may be seen that the semiconductor material 323 is p-doped, and the diode 355 may have a negative threshold voltage $-V_{trigger}$. When the voltage $V_{in}$ of the signal line 307/407 drops below the negative threshold voltage $-V_{trigger}$, the diode 355/455 may become conductive and allow current to flow from ground 403 (i.e., the ground line 303) through the diode 355/455 (and, more specifically, from the ohmic contact 327 through the semiconductor material 323 to the Schottky contact 317) and into the signal line 307/407.

It will be understood that the embodiment of FIG. 4 is intended as an example embodiment and other embodiments may include additional elements to those depicted. For example, additional elements such as resistors, capacitors, etc. are not depicted in FIG. 4 but may be present in real-world embodiments. It will also be understood that other embodiments may have a different configuration than that depicted in FIG. 4. For example, if the semiconductor material 323 was n-doped, then the Schottky contact 317 may be coupled with the ground line 303 and the ohmic contact 327 may be coupled with the signal line 307. In other embodiments, it may be desired for the diode 355/455 to have a positive threshold voltage $+V_{trigger}$. In this embodiment, the depicted diode 455 in the circuit diagram of FIG. 4 may be flipped such that it allows current to flow from the signal line 407 to ground 403, and the physical structure of the diode 355 may be similarly altered (if necessary) based on whether the semiconductor material 323 is n-doped or p-doped.

Figure 5:
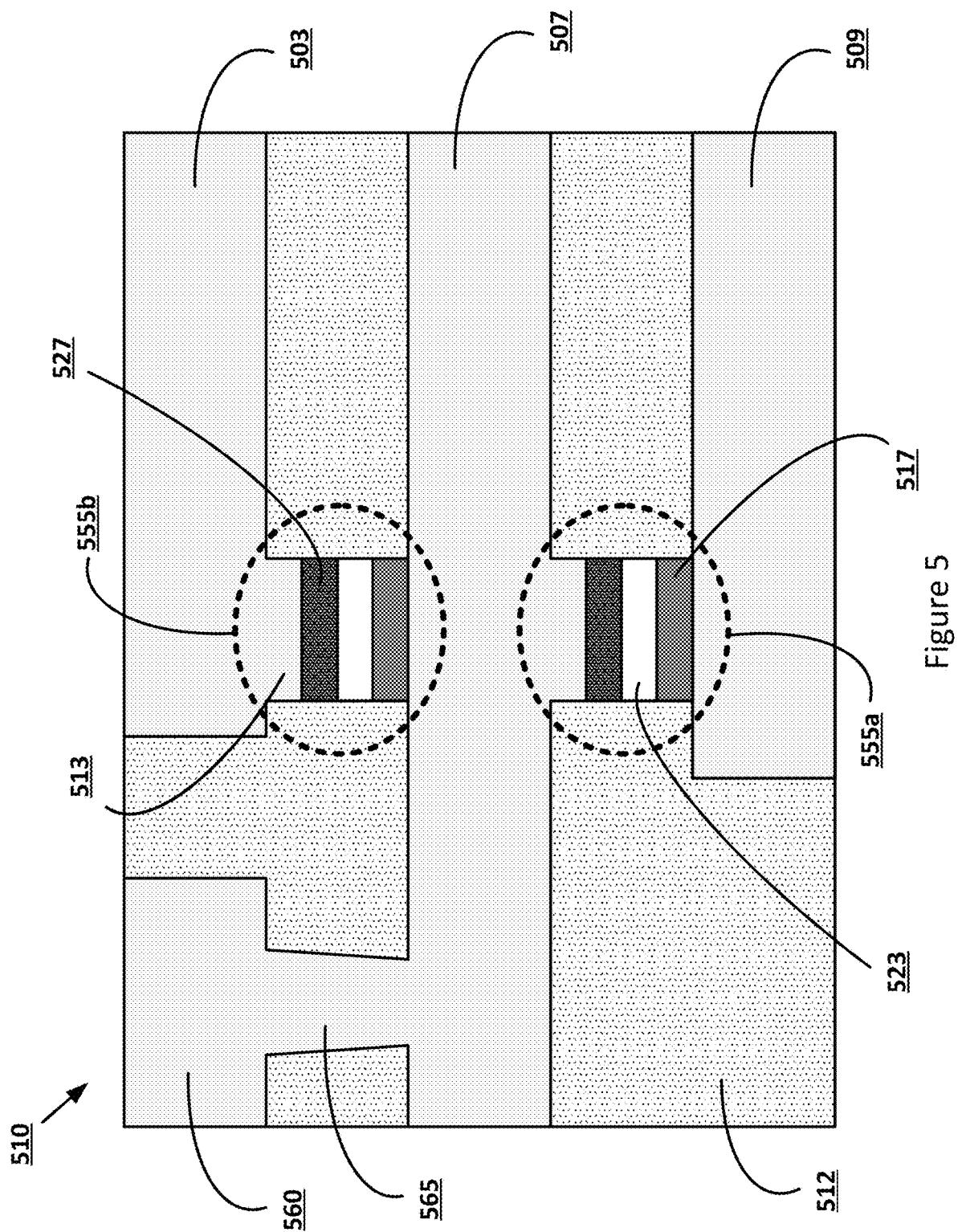
FIG. 5 depicts a simplified cross-sectional view of an alternative die backend with a diode-based ESD protection structure, in accordance with various embodiments.

FIG. 5 depicts an alternative configuration where two diodes may be present. One diode may connect the signal path to ground, and the other diode may connect the signal path to a power line. Specifically, FIG. 5 depicts a simplified cross-sectional view of an alternative backend 510 with a diode-based ESD protection structure, in accordance with various embodiments. It will be understood that although each and every element of FIG. 5 may not be specifically enumerated, elements that are generally identical to one another (e.g., the labelled Schottky contact 517 and the unlabeled Schottky contact) may be considered to have similar properties to one another.

The backend 510 may be similar to, and share one or more characteristics or elements with, the backend 310 of FIG. 3. Specifically, the backend 510 may include a backend material 512, a signal line 507, and a ground line 503 which may be similar to, and share one or more characteristics with, backend material 312, signal line 307, and ground line 303. The backend 510 may further include a diode 555*b* positioned between the signal line 507 and the ground line 503. The diode 555*b* may be similar to, and share one or more characteristics with, diode 355. The diode 555*b* may include an ohmic contact 527, a semiconductor material 523, and a Schottky contact 517. The ground line 503 may include a trace protrusion 513 which may be similar to, and share one or more characteristics with, trace protrusion 313. As described above with respect to trace protrusion 313, the trace protrusion 513 may not be present in some embodiments.

The backend 510 may further include a power line 509. The power line may be coupled with a power source such as a battery or some other power source and configured to provide power to elements of the backend 510, or another element of the die of which the backend 510 is a part. For example, the power line 509 may be coupled with, and provide power to, an IC such as IC 105.

A diode 555a may be positioned between, and coupled to, the signal line 507 and the power line 509. The diode 555a may be similar to, and share one or more characteristics with, diode 555b. Specifically, the diode 555a may include a Schottky contact 517, a semiconductor material 523, and an ohmic contact 527. The diode 555a may be coupled with the signal line 507 by a trace protrusion 513 (which may be optional, as described above).

In some embodiments, the diode 555a may be generally identical to the diode 555b in terms of materials used, relative sizes of various elements, etc. In other embodiments, the diode 555a may use different materials (e.g., have a different material for the Schottky contact 517, a different material for the semiconductor material 523, etc.) than the diode 555b. In some embodiments, the semiconductor material 523 of diode 555a may have a different doping type (e.g., n-doped or p-doped) than the semiconductor material 523 of diode 555b. Similarly, in some embodiments, the diode 555a may have different dimensions than the diode 555b. The specific materials used, dimensions, etc. may vary based on factors such as a desired $+V_{trigger}$ or $-V_{trigger}$ for the diodes, manufacturing considerations, circuit considerations, etc.

The dual-diode structure of the backend 510 may be desirable because it may allow for both positive and negative voltage swings of $V_{in}$, and provide a shunt for the excess current in both directions. For example, in the specific embodiment depicted in FIGS. 5 and 6, the semiconductor material 523 of both diodes 555a and 555b may be p-doped. In this embodiment, current may flow through diode 555b in one direction from the ground line 503 to the signal line 507 (or vice-versa). Similarly, current may flow through diode 555a in one direction from the signal line 507 to the power line 509. As a result, the diode 555b may have one trigger voltage of (e.g., $-V_{trigger}$, and the diode 555a may have another trigger voltage (e.g., $+V_{trigger}$). In some embodiments $+V_{trigger}$ and $-V_{trigger}$ may have the same value (e.g., +5 V and −5V) while in other embodiments $+V_{trigger}$ and $-V_{trigger}$ may have different values.

It will be understood that the above-described embodiment is intended as one example of various voltages or a specific arrangement of the trigger voltages. Other embodiments may vary. For example, in some embodiments the diode 555b may have a positive trigger voltage (e.g., $+V_{trigger}$) and the diode 555a may have a negative trigger voltage (e.g., $-V_{trigger}$). This may occur, for example, if the specific structure of the diodes was altered, the doping of the semiconductor material within the diodes was altered, etc. In some embodiments, both of the diodes 555a and 555b may have positive trigger voltages (e.g., +5V and +10V) or both of the diodes 555a and 555b may have a negative trigger voltage (e.g., −5V and −10V). In some embodiments, one of the trigger voltages may be 0V. Other embodiments may vary.

As may be seen, the backend 510 may further include a via 565 coupled with the signal line 507, and a pad 560 coupled with the via 565. These elements may be used to communicatively couple the signal line 507 to the front-end of a die, and more particularly to an IC such as IC 105. In other words, if the ground line 503 is positioned between the signal line 507 and the front-end of the die, the via 565 and pad 560 may allow for a communicative coupling between the signal line 507 and the IC.

Figure 6:
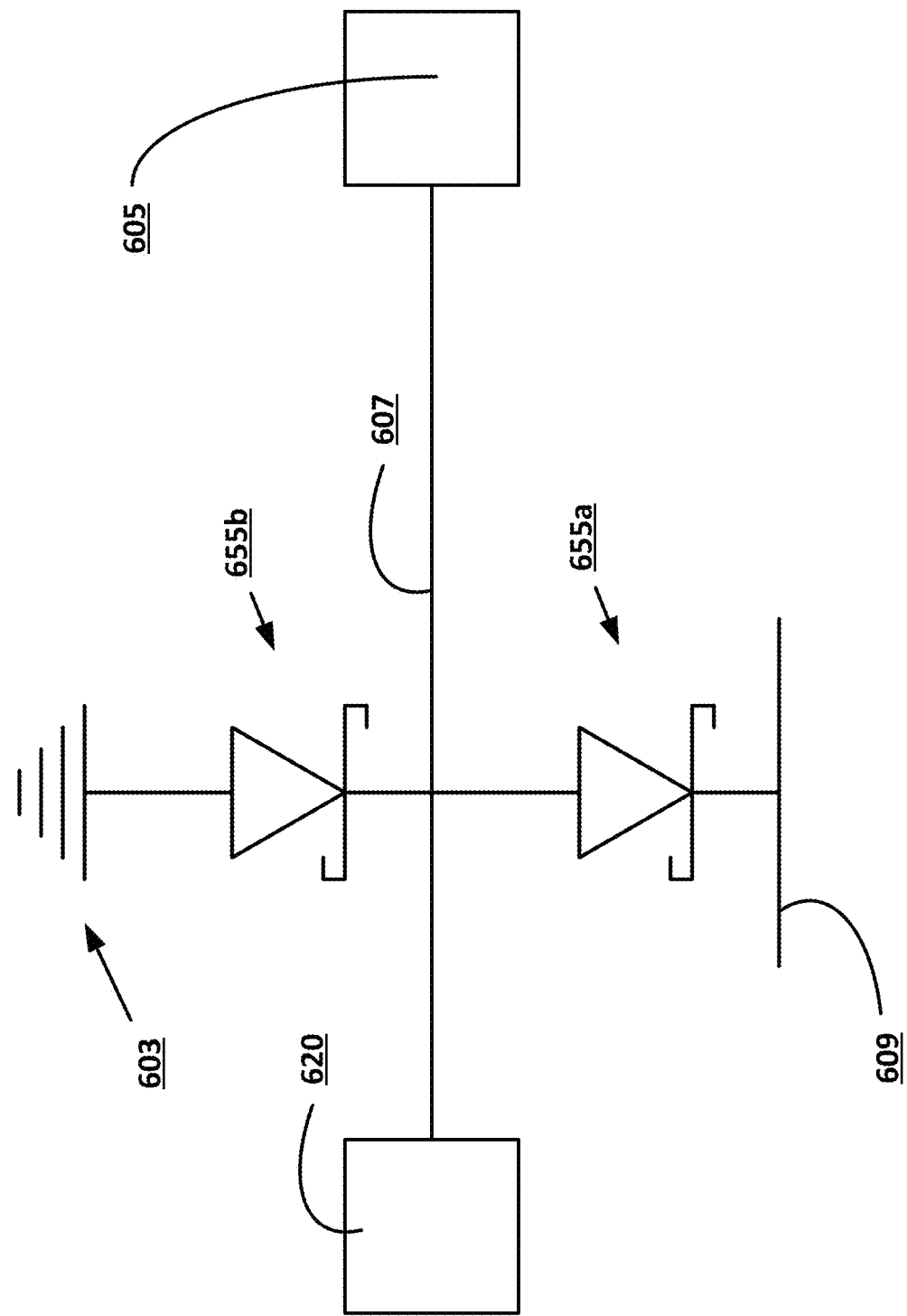
FIG. 6 depicts a simplified circuit diagram of the diode-based ESD protection structure of FIG. 5, in accordance with various embodiments.

FIG. 6 depicts a simplified circuit diagram of the diode-based ESD protection structure of FIG. 5, in accordance with various embodiments. Similarly to the circuit of FIG. 4, the circuit of FIG. 6 may include an interconnect 620, a connection 605, a signal line 607, a diode 655b, and a connection to ground 603 which may be respectively similar to, and share one or more characteristics with, interconnect 420, connection 405, signal line 507, diode 555b, and ground 403. The circuit may further include a power line 609 and a diode 655a. The power line 609 may be similar to, and share one or more characteristics with, power line 509 of FIG. 5. Specifically, the power line 609 may be coupled with a power source such as a battery or some other power source. A diode 655a, which may be similar to diode 655b, may be positioned between, and electrically coupled to, the signal line 607 and the power line 609. As noted above with respect to FIG. 5, in some embodiments the diode 655a may be identical to diode 655b, while in other embodiments the diode 655a and 655b may have one or more characteristics that are different from one another which may result, for example, in the two diodes 655a/655b having different trigger voltages $V_{trigger}$.

As described above, diode 655b/555b may have a trigger voltage of $-V_{trigger}$. If the voltage $V_{in}$ of the signal line 507/607 falls to a value at or below $-V_{trigger}$ (as may occur in an ESD event), then the signal line 507/607 may draw current from ground 603 (e.g., through the ground line 503) through the diode 555b/655b to increase the voltage $V_{in}$ before the IC of the die is harmed. Specifically, the voltage difference between $V_{in}$ of the signal line 507/607 and ground 603 may be such that diode 555b/655b becomes conductive and draws current from the ground line 503 through the p-doped semiconductor material 523 to the Schottky contact 517 of the diode 555b/655b and into the signal line 507/607.

Similarly, diode 655a/555a may have a trigger voltage of $+V_{trigger}$, as described above. If the voltage $V_{in}$ of the signal line 507/607 goes to a value at or above $+V_{trigger}$ (as may occur in an ESD event), then the signal line 507/607 may shunt current from the signal line 507/607 through the diode 555a/655a to the power line 509 to decrease the voltage $V_{in}$ before the IC is harmed. Specifically, the voltage difference between $V_{in}$ of the signal line 507/607 and the power line 509/609 may be such that the diode 555a/655a becomes conductive and draws current from the signal line 507/607 through the p-doped semiconductor material 523 to the Schottky contact 517 of the diode 555a/655a and into the power line 509/609.

Similarly to FIGS. 3 and 4, it will be understood that FIGS. 5 and 6 are intended as an example embodiment, and other embodiments may vary from the specific configuration of FIG. 5 or 6. For example, in some embodiments the ground line 503 may be below the signal line 507, and the power line 509 may be above the signal line 507 (with respect to the orientation of FIG. 5). Additionally, the circuit diagram of FIG. 6 may include one or more additional elements such as additional resistors, capacitors, etc. Additionally, as described above with respect to FIGS. 3 and 4, it will be understood that FIGS. 5 and 6 are one example depiction of a specific arrangement of Schottky diodes and a circuit diagram. In some embodiments, the arrangement of one or both of diodes 555a and 555b (e.g., which line the Schottky contact of the diode is closest to) may be based on the type of doping of the semiconductor material of that diode. In some embodiments, the semiconductor materials of diodes 555a and 555b may be doped differently from one another (i.e., one may be n-doped and the other may be p-doped). Similarly, in some embodiments the diodes 655a and 655b may be switched such that, for example, diode 655b is configured to draw current from signal line 607 into ground 603, diode 655a is configured to draw current from power line 609 into signal line 607, or both. In some embodiments, the specific threshold voltage of the diodes, and whether it is positive or negative (i.e., $+V_{trigger}$ or $-V_{trigger}$) may differ based on the physical structure of the diodes, the direction in which it is desired to draw current, etc. Such differences may be based on factors such as materials used, use cases of the resultant die or circuit (or microelectronic package), design considerations, etc.

In some embodiments, it may be desirable to combine aspects of the backends of FIGS. 3 and 5. For example, FIG. 3 may be seen to depict only a signal line 307 and a ground line 303 with a single diode. In this embodiment, current may only flow in one direction if, for example, the voltage along the signal line is significantly higher than above the ground line and, more specifically, above $V_{trigger}$. However, if the voltage swings too low (e.g., below $-V_{trigger}$), the ESD protection of FIG. 3 may not provide significant protection. By contrast, FIG. 5 may offer ESD protection based on both $+V_{trigger}$ and $-V_{trigger}$, as described above. However, such additional protection may be based on the presence of both a ground line 503 and a power line 509.

Figure 13:
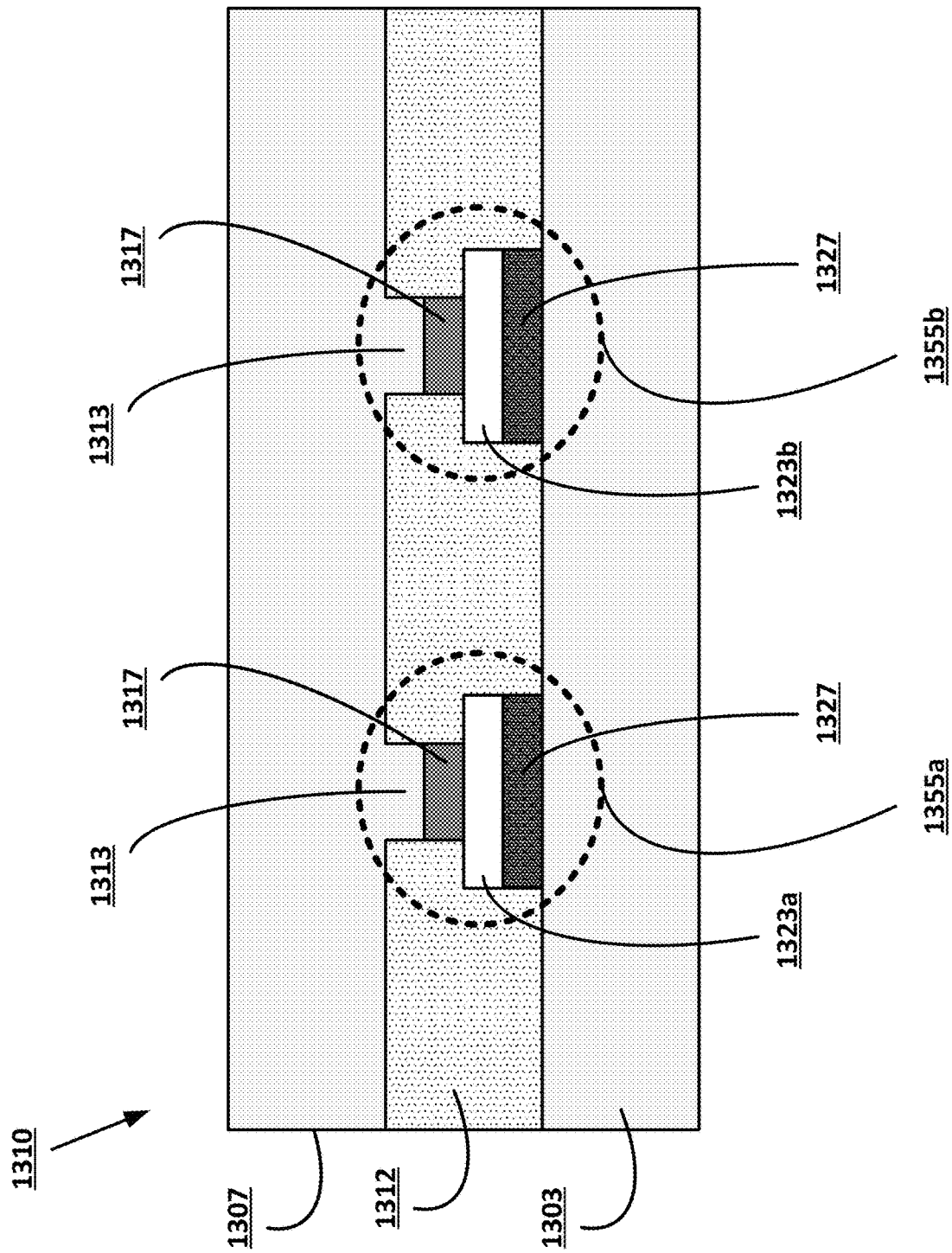
FIG. 13 illustrates a simplified cross-sectional view of an alternative die backend with a diode-based ESD protection structure, in accordance with various embodiments.

FIG. 13 depicts an example configuration that may combine aspects of the backends of both FIGS. 3 and 5. Specifically, FIG. 13 illustrates a simplified cross-sectional view of an alternative backend 1310 with a diode-based ESD protection structure, in accordance with various embodiments. In FIG. 13, an n-doped diode and a p-doped diode may be used to couple a signal line and a ground line, thereby providing ESD protection for both positive and negative voltage swings without the use of an extra line.

Specifically, FIG. 13 depicts a backend 1310 which may be similar to, and share one or more characteristics with, backend 310. The backend 1310 may include a signal line 1307, a ground line 1303, and a backend material 1312 which may be respectively similar to, and share one or more characteristics with, signal line 307, ground line 303, and backend material 312. The signal lines 1307 may include trace protrusions 1313 which may be similar to, and share one or more characteristics with, trace protrusions 313.

The backend 1310 may further include a pair of diodes 1355a and 1355b (collectively "diodes 1355"). Respective ones of the diodes 1355a and 1355b may include a Schottky contact 1317, an ohmic contact 1327, and a semiconductor material 1323a and 1323b (collectively, "semiconductor material 1323"), which may each be respectively similar to Schottky contacts 317, ohmic contact 327, and semiconductor material 323. In this specific embodiment, the semiconductor material 1323a may be p-doped, which may result in the Schottky diode 1355a (which would be a p-doped Schottky diode) allowing current to flow from the ground line 1303 to the signal line 1307. Also, the semiconductor material 1323b may be n-doped, which may result in the Schottky diode 1355b (which would be an n-doped Schottky diode) allowing current to flow from the signal line 1307 to the ground line 1303.

Figure 14:
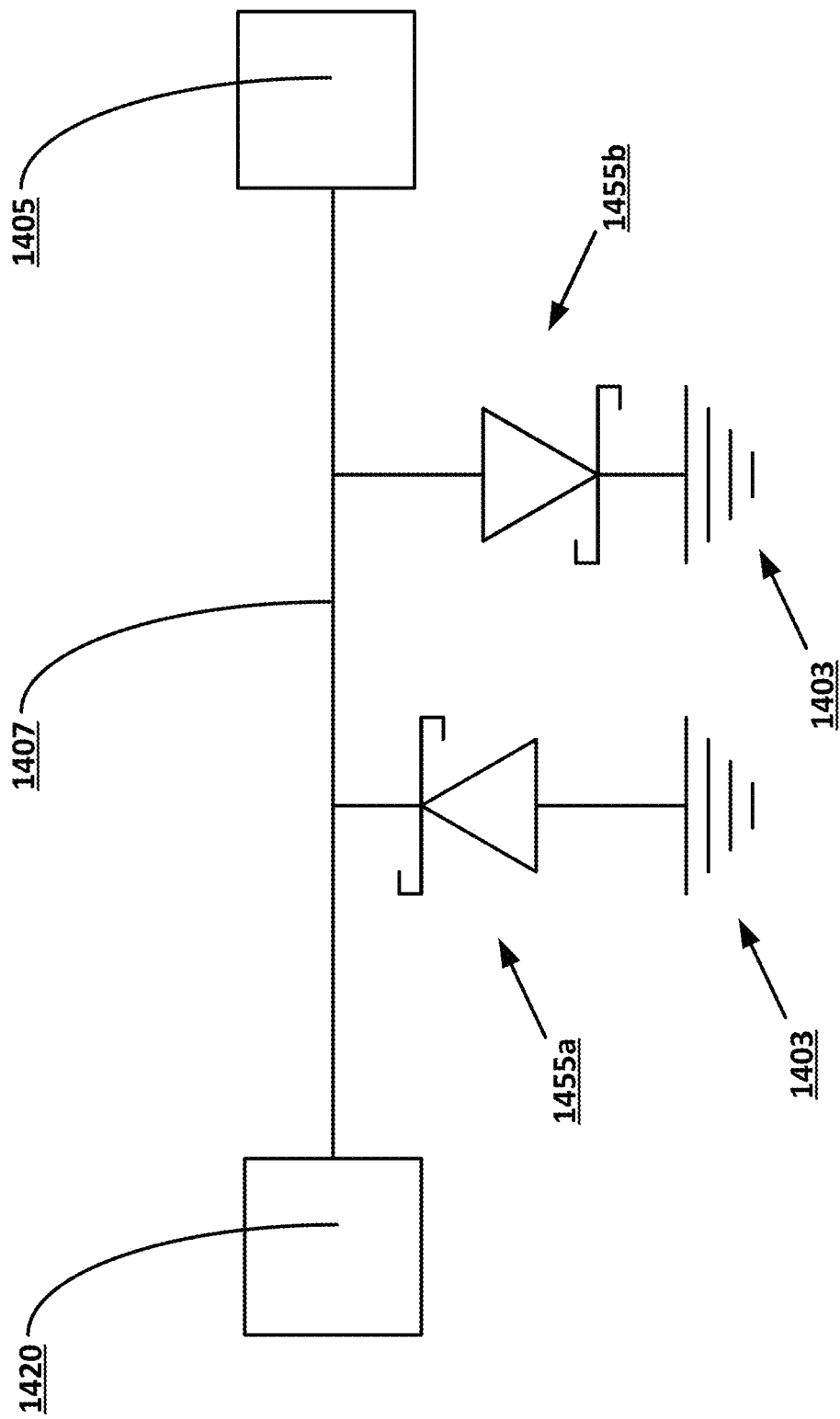
FIG. 14 illustrates a simplified circuit diagram of the diode-based ESD protection structure of FIG. 13, in accordance with various embodiments.

FIG. 14 depicts a simplified circuit diagram of the diode-based ESD protection structure of FIG. 13, in accordance with various embodiments. Similarly to other circuits described herein, the circuit of FIG. 14 may include an interconnect 1420, a connection 1405, a signal line 1407, diodes 1455a and 1455b, and connections to ground 1403 which may be respectively similar to, and share one or more characteristics with, interconnect 420, connection 405, signal line 1307, diodes 1355a and 1355b, and ground 403.

As previously noted, and as depicted in FIG. 14, the diodes 1355a/1455a and 1355b/1455b may be differently doped. Specifically, diode 1355a/1455a may be p-doped, and diode 1355b/1455b may be n-doped. As such, the p-doped diode 1355a/1455a may have a negative voltage threshold $-V_{trigger}$ such that if the signal voltage $V_{in}$ of the signal line 1307/1407 falls at or below $-V_{trigger}$, the p-doped diode 1355a/1455a may become conductive and draw current from ground 1403 (for example, from the ground line 1303 through the semiconductor material 1323a to the Schottky contact 1317 and into the signal line 1307). By contrast, the n-doped diode 1355b/1455b may have a positive voltage threshold $+V_{trigger}$ such that if the signal voltage $V_{in}$ of the signal line 1307/1407 rises at to a value at or above $+V_{trigger}$, the n-doped diode 1355b/1455b may become conductive and shunt excess current from the signal line 1307/1407 to ground 1403 (for example, from the signal line 1307 through the Schottky contact 1317 to the n-doped semiconductor material 1323b and into the ground line 1303). In this way, a die coupled with the backend 1310 may be protected from both positive and negative ESD events while only using a single signal line and a single ground line.

Figure 15:
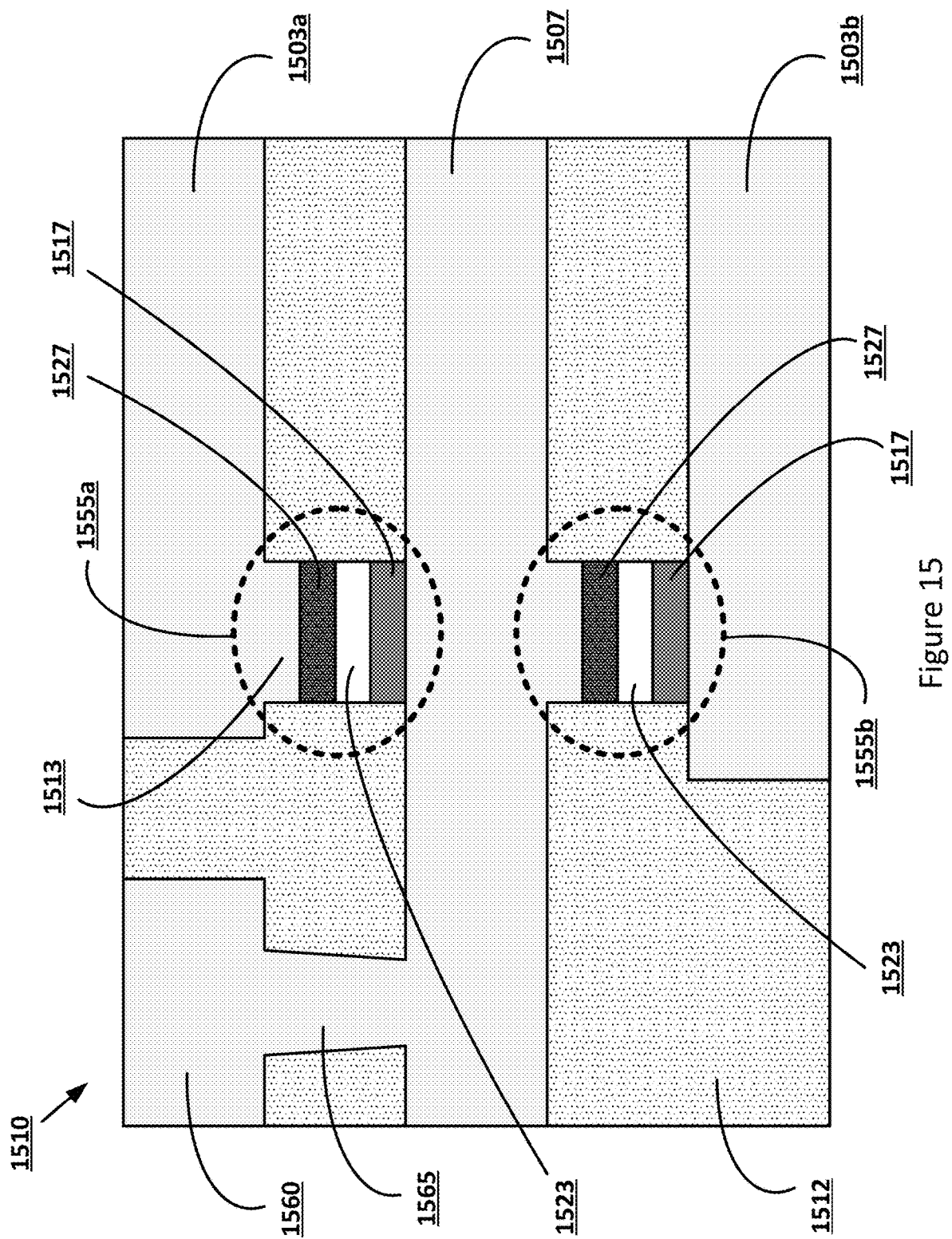
FIG. 15 illustrates a simplified cross-sectional view of an alternative die backend with a diode-based ESD protection structure, in accordance with various embodiments.

FIG. 15 depicts another example configuration that may combine aspects of the backends of both FIGS. 3 and 5. Specifically, FIG. 15 illustrates a simplified cross-sectional view of an alternative backend 1510 with a diode-based ESD protection structure, in accordance with various embodiments.

Backend 1510 may be similar to, and share one or more characteristics with, backend 510. For example, the backend 1510 may include a backend material 1512, a signal line 1507, trace protrusions 1513, a pad 1560, and a via 1565 which may be respectively similar to, and share one or more characteristics with, backend material 512, signal line 507, trace protrusions 513, pad 560, and via 565. As can be seen, backend 1510 may include at least two ground lines 1503a and 1503b (collectively "ground lines 1503") which may be respectively similar to, and share one or more characteristics with, ground line 503. The ground lines 1503 may be positioned on opposite sides of the signal line 1507 (although, as mentioned elsewhere, in some embodiments the exact configuration of the various signal lines may be different in different embodiments).

The backend 1510 may further include diodes 1555a and 1555b (collectively, "diodes 1555") which may be respectively similar to, and share one or more characteristics with, diodes 555a and 555b. As can be seen, diode 1555a may couple the signal line 1507 and ground line 1503a, while the other of the diodes 1555b may couple the signal line 1507 and ground line 1503b. Each of the diodes 1555 may include an ohmic contact 1527, a semiconductor material 1523, and a Schottky contact 1517 which may be respectively similar to, and share one or more characteristics with, ohmic contact 527, semiconductor material 523, and Schottky contact 517.

Figure 16:
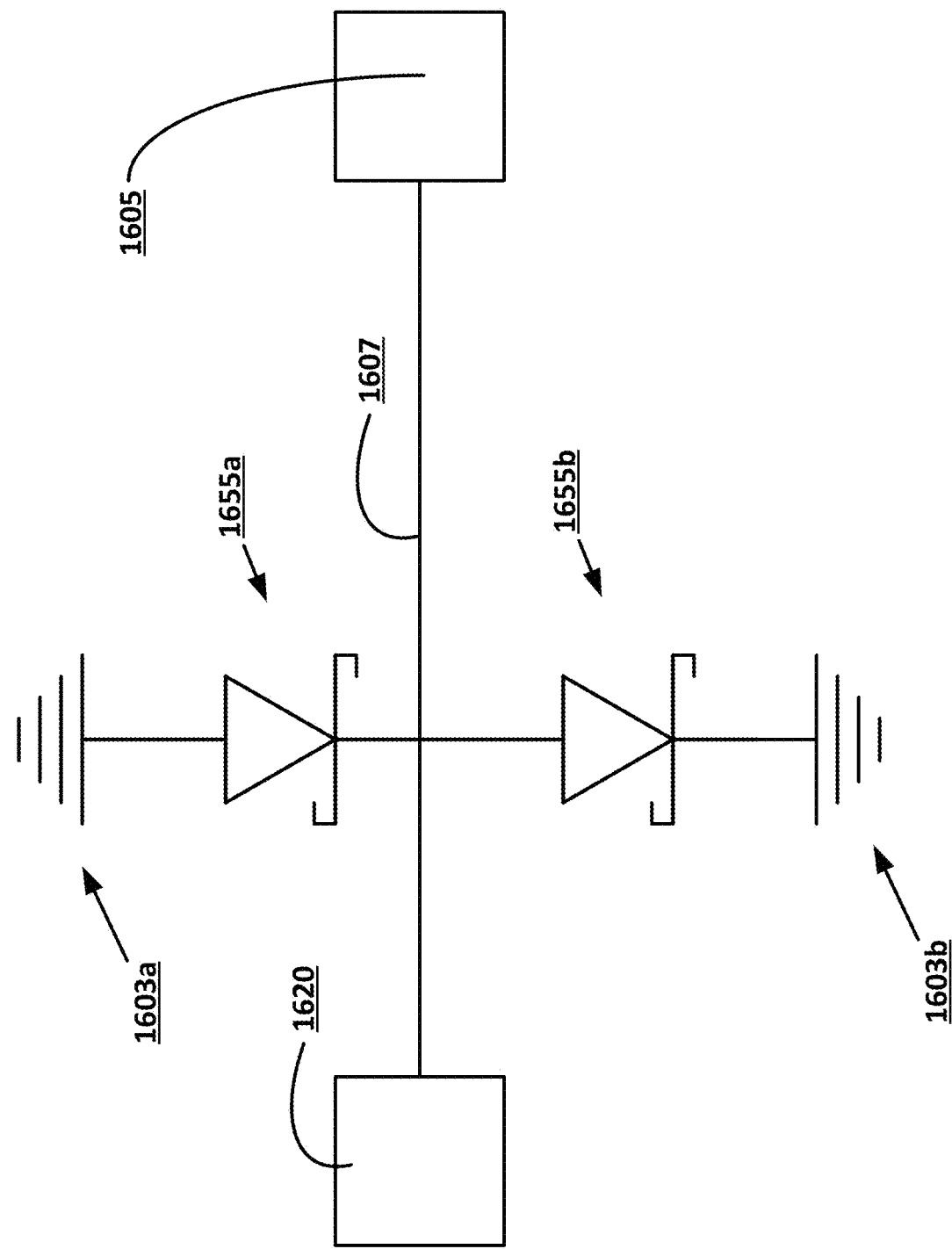
FIG. 16 illustrates a simplified circuit diagram of the diode-based ESD protection structure of FIG. 15, in accordance with various embodiments.

FIG. 16 depicts a simplified circuit diagram of the diode-based ESD protection structure of FIG. 15, in accordance with various embodiments. Similarly to other circuits described herein, the circuit of FIG. 16 may include an interconnect 1620, a connection 1605, a signal line 1607, and diodes 1655*a* and 1655*b* (collectively, "diodes 1655"), which may be respectively similar to, and share one or more characteristics with, interconnect 420, connection 405, signal line 1507, and diodes 1555*a* and 1555*b*. The circuit of FIG. 16 may further include connections to ground 1603*a* and 1603*b*, which may be respectively similar to ground 403.

In the embodiment of FIGS. 15 and 16, the semiconductor material 1523 of the diodes 1555/1655 may be p-doped. As such, the diodes 1555 may allow current to flow from the p-doped semiconductor material 1523 to the Schottky contact 1517 of the respective diodes 1555. More specifically, as can be seen in FIG. 16, the p-doped diode 1655*a* may allow current to flow from ground 1603*a* (i.e., ground line 1503*a*) to the signal line 1507/1607. The p-doped diode 1655*b* may allow current to flow from the signal line 1507/1607 to ground 1603*b* (i.e., the ground line 1503*b*).

In this embodiment, diode 1555*a*/1655*a* may have a threshold voltage of $-V_{trigger}$. When the signal voltage $V_{in}$ of the signal line 1507/1607 is at or below $-V_{trigger}$, the diode 1555*a*/1655*a* may become conductive and the signal line 1507/1607 is able to draw current from ground 1603*a* (e.g., by way of the ground line 1503*a*). By contrast, diode 1555*b*/1655*b* may have a threshold voltage of $+V_{trigger}$. When the signal voltage $V_{in}$ of the signal line 1507/1607 is at or above $+V_{trigger}$, the diode 1555*b*/1655*b* may become conductive and shunt excess current from the signal line 1507/1607 through the diode 1555*b*/1655*b* to ground 1603*b* (e.g., by way of the ground line 1503*b*). In this way, similarly to other embodiments, an IC coupled with the signal line 1507/1607 should be protected from excess voltage swings (such as those caused by an ESD event) in either the positive or negative direction.

Similarly to other embodiments described herein, it will be understood that the specific configurations depicted in FIGS. 13-16 are intended as example embodiments, and other embodiments may vary in terms of the size, shape, or position of various materials such as the contacts or lines, the specific doping of the semiconductor material, whether a diode has a positive or negative voltage threshold, and direction in which current may flow through a diode, etc. as described above with respect to, for example, FIGS. 5 and 6. Similarly to the other embodiments, the specific configuration of a diode may be based on factors such as materials used, design considerations, manufacturing considerations, use cases, etc.

In some embodiments, rather than having the various lines and diodes spanning multiple layers of the backend, the structures and the diodes may be placed in a single layer of the backend and be arranged in a lateral configuration rather than the multi-layer configuration of other embodiments depicted herein.

Figure 7:
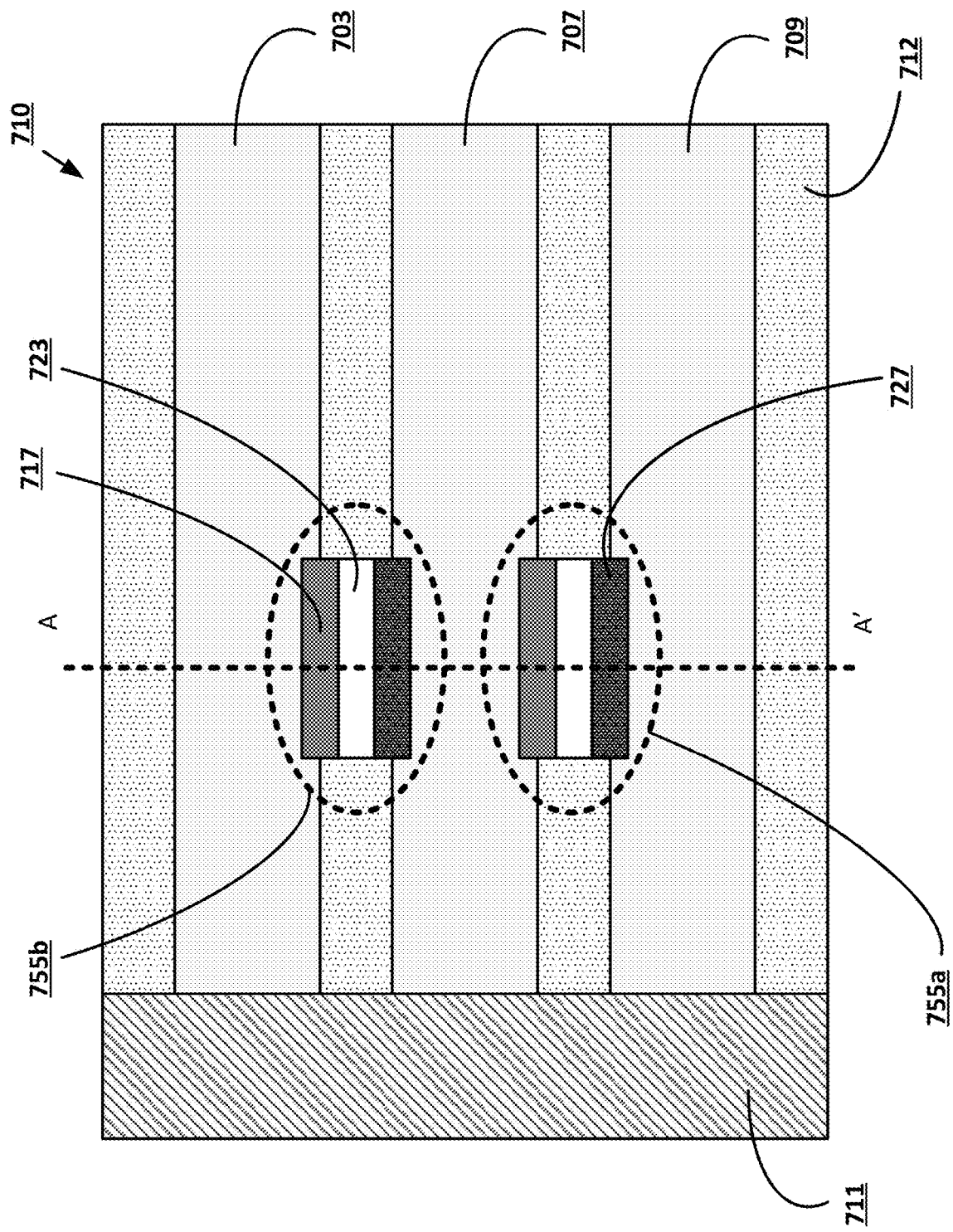
FIG. 7 depicts a simplified top-down view of a die backend with a diode-based ESD protection structure, in accordance with various embodiments.
Figure 8:
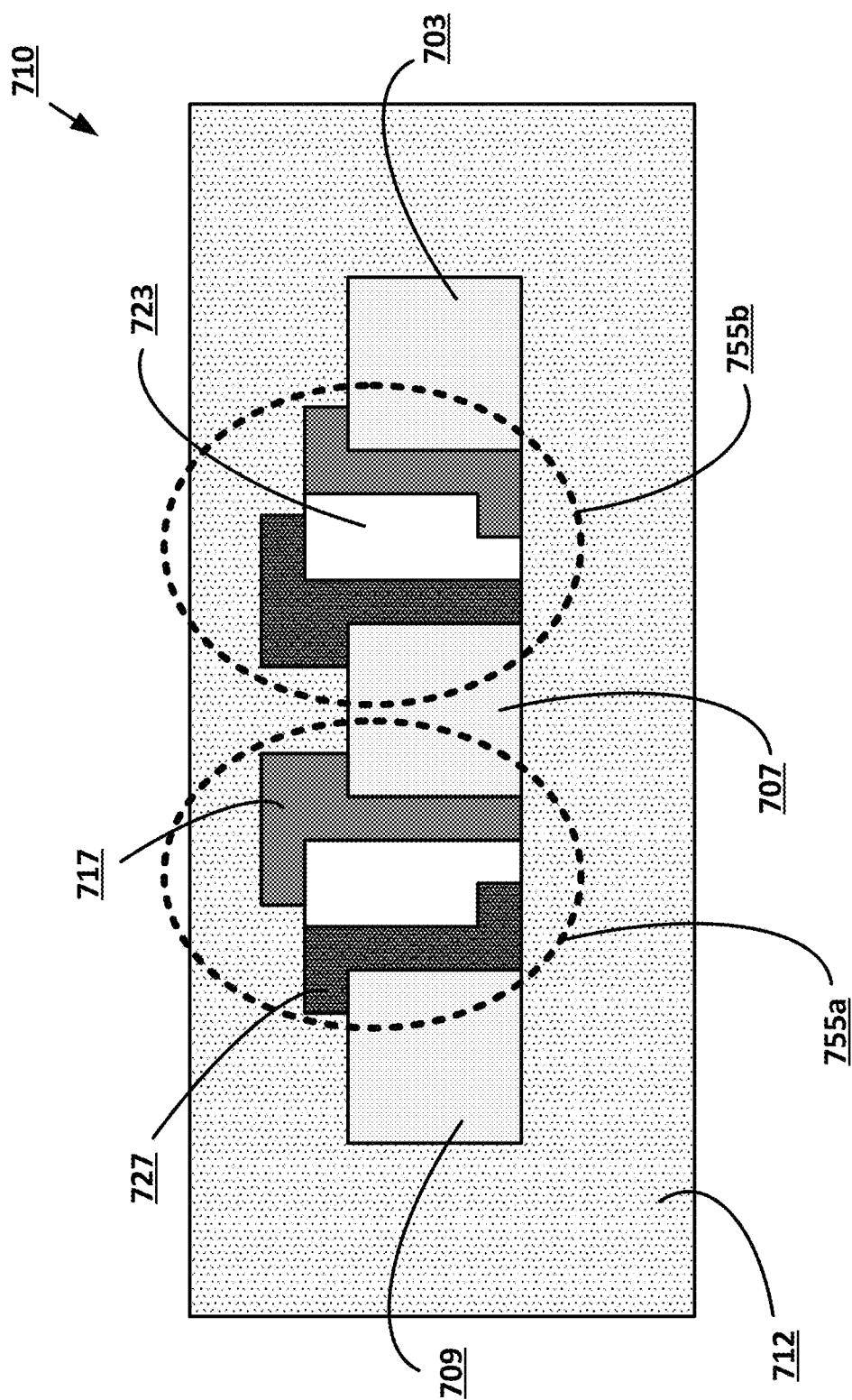
FIG. 8 depicts a simplified cross-sectional view of the die backend of FIG. 7, in accordance with various embodiments.

FIG. 7 depicts a simplified top-down view of a backend 710 with a diode-based ESD protection structure, in accordance with various embodiments. FIG. 8 depicts a simplified cross-sectional view of the backend 710 of FIG. 7 along line A-A', in accordance with various embodiments.

The backend 710 may include a backend material 712, ground line 703, a signal line 707, and a power line 709 which may be similar to, and share one or more characteristics with, backend material 312, ground line 303, signal line 307, and power line 309. However, as may be seen in FIGS. 7 and 8, the ground, signal, and power lines 303/307/309 may be arranged in a single layer of the backend 710 rather than multiple layers as depicted with respect to other embodiments herein such as the embodiments of FIGS. 3, 5, etc. As can be seen in FIG. 7, the ground, signal, and power lines 703/707/709 may be communicatively coupled with a front-end 711 which may be similar to, and share one or more characteristics with, front-end 111.

The backend 710 may further include a diode 755*b* positioned between the ground line 703 and the signal line 707, and a diode 755*a* positioned between the signal line and the power line 709. The diodes 755*b* and 755*a* may be respectively similar to, and share one or more characteristics with, diodes 555*b* and 555*a*. Specifically, the diodes 755*b* and 755*a* may include a Schottky contact 717, a semiconductor material 723, and an ohmic contact 727 which may be respectively similar to, and share one or more characteristics with, Schottky contact 517, semiconductor material 523, and ohmic contact 527.

It will also be noted that in FIG. 8 various of the elements of the diodes 755*a* and 755*b* may at least partially overlap one another. For example, the semiconductor material 723 may at least partially overlap the ohmic contact 727, and the Schottky contact 717 may at least partially overlap the semiconductor material 723 and the signal line 707. The reason for this overlap may be because manufacturing tolerances may not permit perfect (e.g., non-overlapping) alignment. However, in some embodiments the depicted overlap may be eliminated, for example through the use of self-aligned manufacturing processes.

Figure 17:
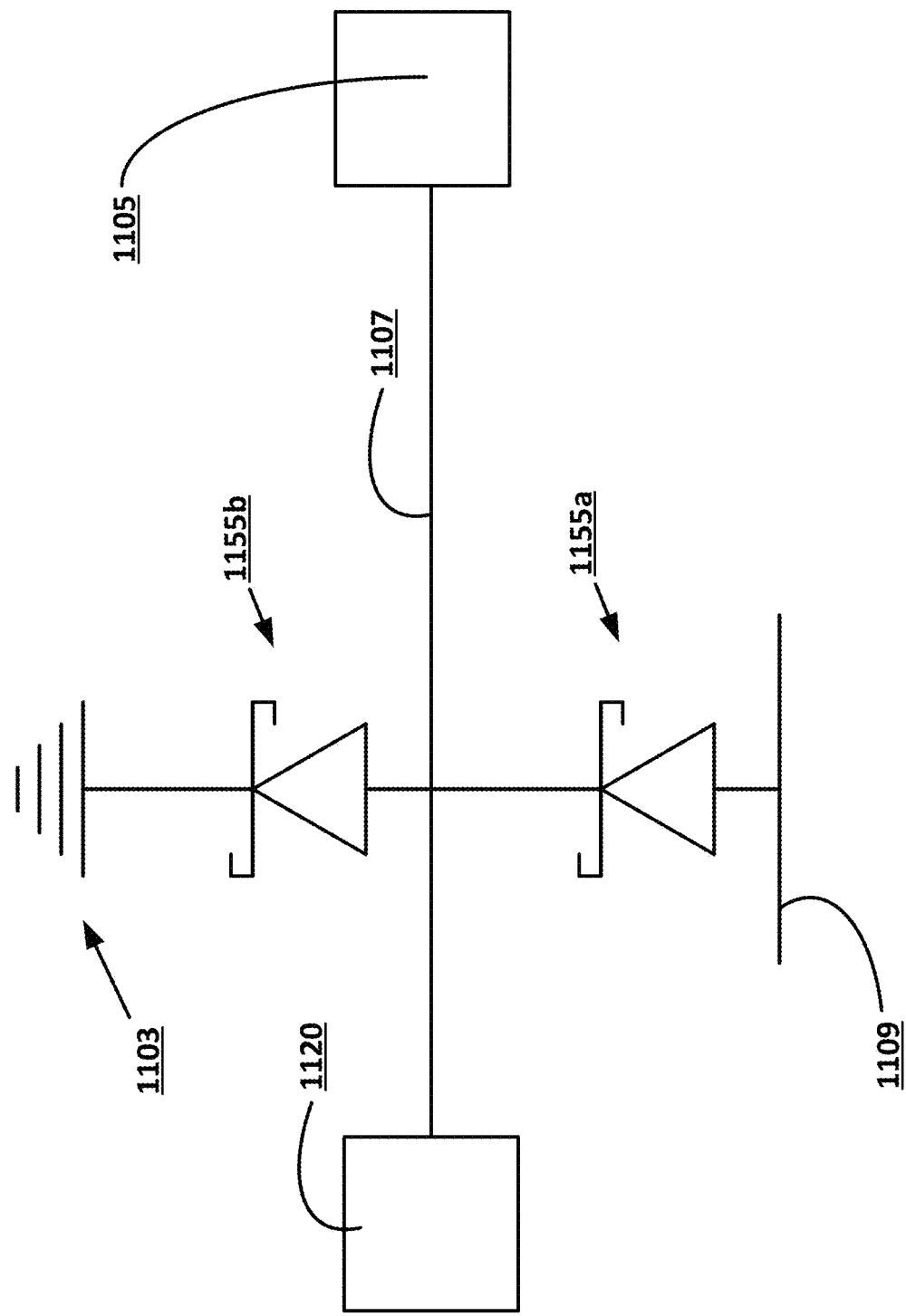
FIG. 17 depicts a simplified circuit diagram of the diode-based ESD protection structure of FIGS. 7 and 8, in accordance with various embodiments.

FIG. 17 depicts a simplified circuit diagram of the diode-based ESD protection structure of FIGS. 7 and 8, in accordance with various embodiments. Similarly to the circuit of FIG. 4 or 6 (or other Figures herein), the circuit of FIG. 17 may include an interconnect 1120, a connection 1105, a signal line 1107, diodes 1155*a* and 1155*b*, a power line 1109, and a connection to ground 1103 which may be respectively similar to, and share one or more characteristics with, interconnect 420, connection 405, signal line 707, diodes 755*a* and 755*b*, power line 709, and connection to ground 403.

In the embodiment of FIGS. 7, 8, and 17, it will be noted that the semiconductor material 723 of diodes 755*a*/1155*a* and 755*b*/1155*b* may be p-doped. That is, the semiconductor material 723 may draw current from the semiconductor material 723 to the Schottky contact 717 of the diodes. In this embodiment, diode 755*b*/1155*b* may have a positive trigger voltage $+V_{trigger}$ such that when the signal voltage $V_{in}$ of the signal line 707/1107 is at or above $+V_{trigger}$, the diode 755*b*/1155*b* may become conductive and shunt excess current from the signal line 707/1107 to the ground line 703 and ground 1103. Similarly, diode 755*a*/1155*a* may have a negative trigger voltage $-V_{trigger}$ such that when the signal voltage $V_{in}$ of the signal line 707/1107 is at or below $-V_{trigger}$, the diode 755*a*/1155*a* may be come conductive and draw current from the power line 709/1109 through the diode 755*a*/1155*a* to the signal line 707/1107.

Similarly to other embodiments described above, it will be understood that the embodiment of FIGS. 7, 8, and 17 are intended as an example embodiment and other embodiments may vary in terms of the specific size of materials, the specific configuration, the specific shape, etc. For example, in some embodiments one or both of the diodes 755*a* and 755*b* may be configured such that the Schottky contacts or ohmic contacts are coupled with a line (e.g., signal line, ground line, power line, etc.) that is different than the one depicted in the Figures. In some embodiments, the semiconductor material, the values (positive or negative) of the various trigger voltages, the direction which the current may flow through the diodes, etc. may be different in different embodiments. In some embodiments the ohmic contacts 727 or the Schottky contacts 717 may not be present in one or both of the diodes 755a. Some embodiments may combine aspects of the embodiments of FIG. 3 or 5 with aspects of the embodiments of FIGS. 7 and 8. Specifically, one of the lines (e.g., the ground line 703) may be adjacent to the signal line 707 in a same layer of the backend 710, and another of the lines (e.g., the power line) 709 may be adjacent to the signal line 707 in a different layer of the backend 710. Other variations may be present in other embodiments. The specific configurations, doping, direction of current flow, etc. may be based on aspects such as use cases, materials used, manufacturing considerations, design considerations, etc.

Figure 9:
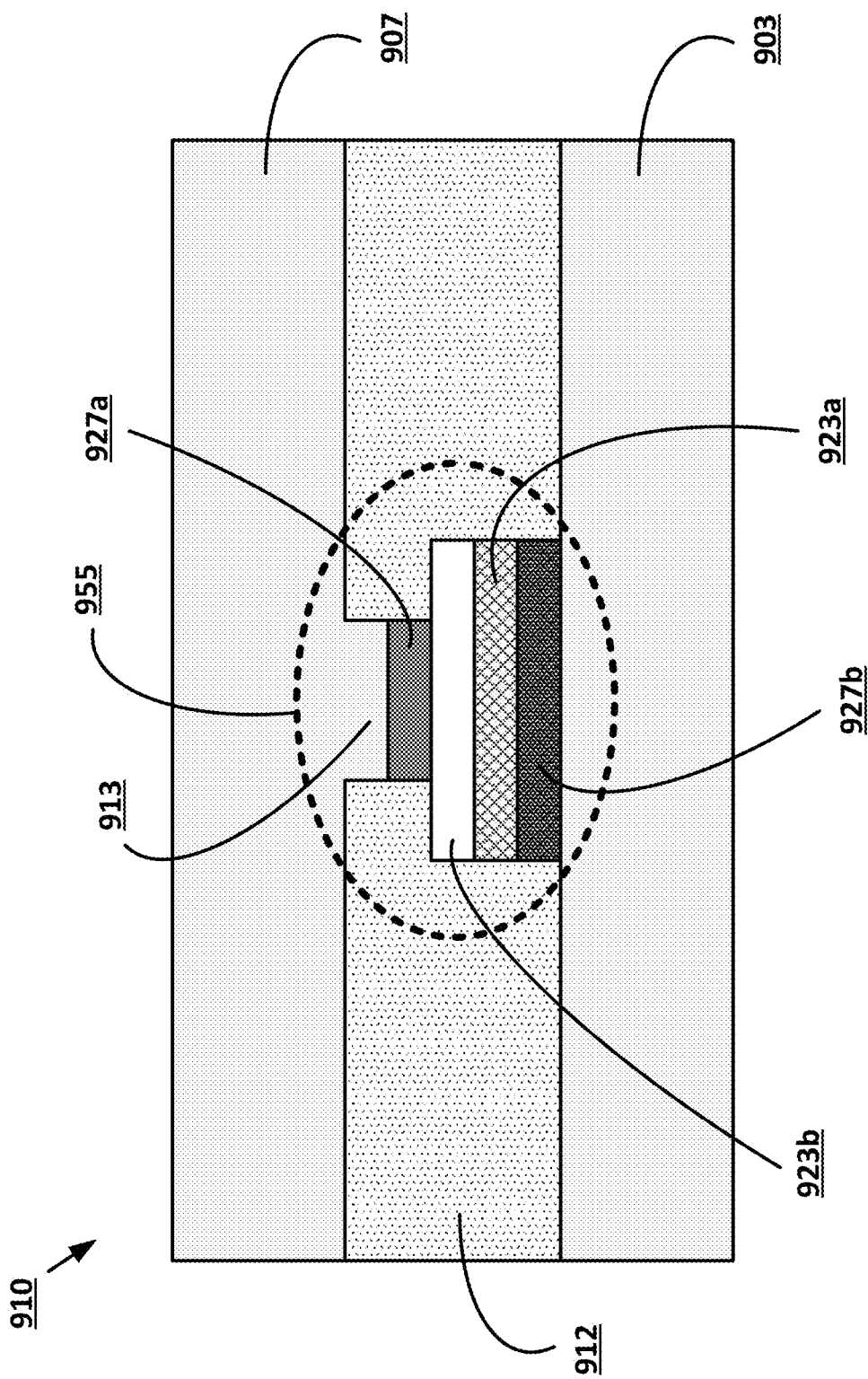
FIG. 9 depicts a simplified cross-sectional view of an alternative die backend with a diode-based ESD protection structure, in accordance with various embodiments.

In some embodiments, the ESD protection structure may include a pn-junction diode rather than a Schottky diode. FIG. 9 depicts such an example using a pn-junction diode. Specifically, FIG. 9 depicts a simplified cross-sectional view of an alternative backend 910 with a diode-based ESD protection structure, in accordance with various embodiments.

The backend 910 may be similar to, and include one or more characteristics of, backend 310. Specifically, the backend 910 may include a signal line 907, a backend material 912, and a ground line 903, which may be respectively similar to, and share one or more characteristics of, signal line 307, backend material 312, and ground line 303. The signal line 907 may include a trace protrusion 913, which may be similar to, and share one or more characteristics with, trace protrusion 313.

The backend 910 may also include a diode 955. The diode 955 may include two ohmic contacts 927a and 927b, which may be respectively similar to ohmic contact 327. The diode 955 may additionally include two semiconductor materials 923a and 923b. One of the semiconductor materials, e.g. semiconductor material 923b, may be an n-type semiconductor material. The other of the semiconductor materials, e.g. semiconductor material 923a, may be a p-type semiconductor material. The specific configuration of the semiconductor materials 923a and 923b may rectify the diode 955 such that current may only flow in a single direction through the diode 955, e.g. from signal line 907 to ground line 903, when the voltage $V_{in}$ is at or above $V_{trigger}$. In this way, the diode 955 may serve as an ESD protection structure in a manner similar to that of diode 355 described above. The circuit diagram of the backend 910 may be generally similar, or identical, to the circuit diagram depicted in FIG. 4 with respect to FIG. 3.

Similarly to other Figures herein, it will be understood that FIG. 9 is intended as an example embodiment, and other embodiments may vary from the specific configuration of FIG. 9. For example, the embodiment of FIG. 5 may vary as described above with respect to FIG. 3. For example, in some embodiments the ground line 503 may be below the signal line 507, and the power line 509 may be above the signal line 507. In some embodiments, the locations of the n-type semiconductor material 923b and the p-type semiconductor material 923a may be switched dependent on the desired rectification of the diode 955.

As can be seen the n-side (e.g., the side on which the n-type semiconductor material 923b is present) and the p-side (e.g., the side on which the p-type semiconductor material 923a is present) of the diode include ohmic contacts 927a and 927b. However, the n-type semiconductor material 923b and the p-type semiconductor material 923a may have entirely different work functions. As a result, the ohmic contacts 927a and 927b may be formed of two dissimilar metals, that is, the material of the ohmic contact 927a may be different than the material of the ohmic contact 927b.

Figure 18:
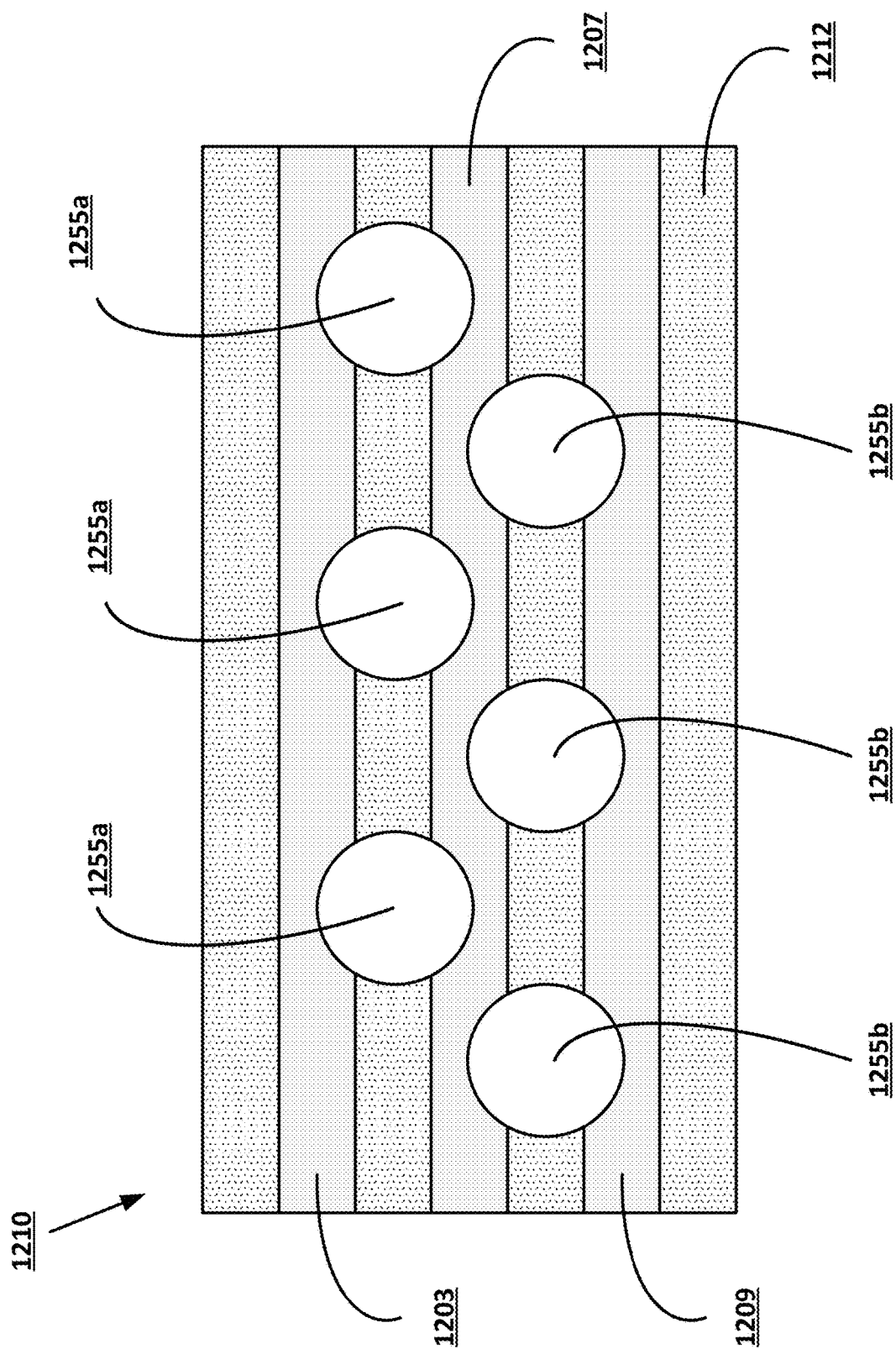
FIG. 18 depicts a simplified view of an array of diodes in an ESD protection structure of a die backend, in accordance with various embodiments.

It will be understood that although various embodiments herein are described as including a single diode coupling two lines, in some embodiments the backend may include an array of diodes that perform an ESD protection function for a die. FIG. 18 depicts a simplified top-down view of an array of diodes in an ESD protection structure of a die backend, in accordance with various embodiments.

Specifically, FIG. 18 depicts a backend 1210 which may be similar to, and share one or more characteristics of, backend 310. The backend 1210 may include a backend material 1212, a ground line 1203, a signal line 1207, and a power line 1209, which may be respectively similar to, and share one or more characteristics with, backend material 312, ground line 303, signal line 307, and power line 309.

The backend 1210 may further include a number of diodes 1255a and 1255b. Specifically, diodes 1255a may be positioned between, and communicatively couple, the signal line 1207 and the ground line 1203. Diodes 1255b may be positioned between, and communicatively couple, the signal line 1207 and the power line 1209.

The diodes 1255a and 1255b are depicted in FIG. 18 as featureless circles because the diodes 1255a and 1255b may have a variety of properties of diodes described herein. For example, one or more of the diodes may be a Schottky diode or a pn-junction diode. One or more of the diodes may be p-doped or n-doped, which may likewise influence the specific configuration of how the Schottky contact and the semiconductor material are arranged within the diode.

Additionally, not all of the diodes 1255a and 1255b may be identical to one another. For example, one of diodes 1255a may be a Schottky diode and another of diodes 1255a may be a pn-junction diode. Other variations may be present. For example, one may be p-doped and another may be n-doped. One may allow current flow from the ground line 1203 to the signal line 1207, while another may allow current flow from the signal line 1207 to the ground line 1203. In some embodiments, they may have different threshold voltages.

Other variations may be present in other embodiments. For example, in some embodiments the diodes 1255a and 1255b may not be placed in a staggered array as shown, but rather may be positioned in a different configuration. In some embodiments, the diode may be in a 2D or three-dimensional (3D) configuration. In some embodiments the configuration or presence of various lines may be different, for example lacking the power line 1209, replacing the power line 1209 with another ground line 1203, configuring the lines in a single layer of the backend 1210 rather than a plurality of layers, etc. Other variations may be present in other embodiments.

Figure 10:
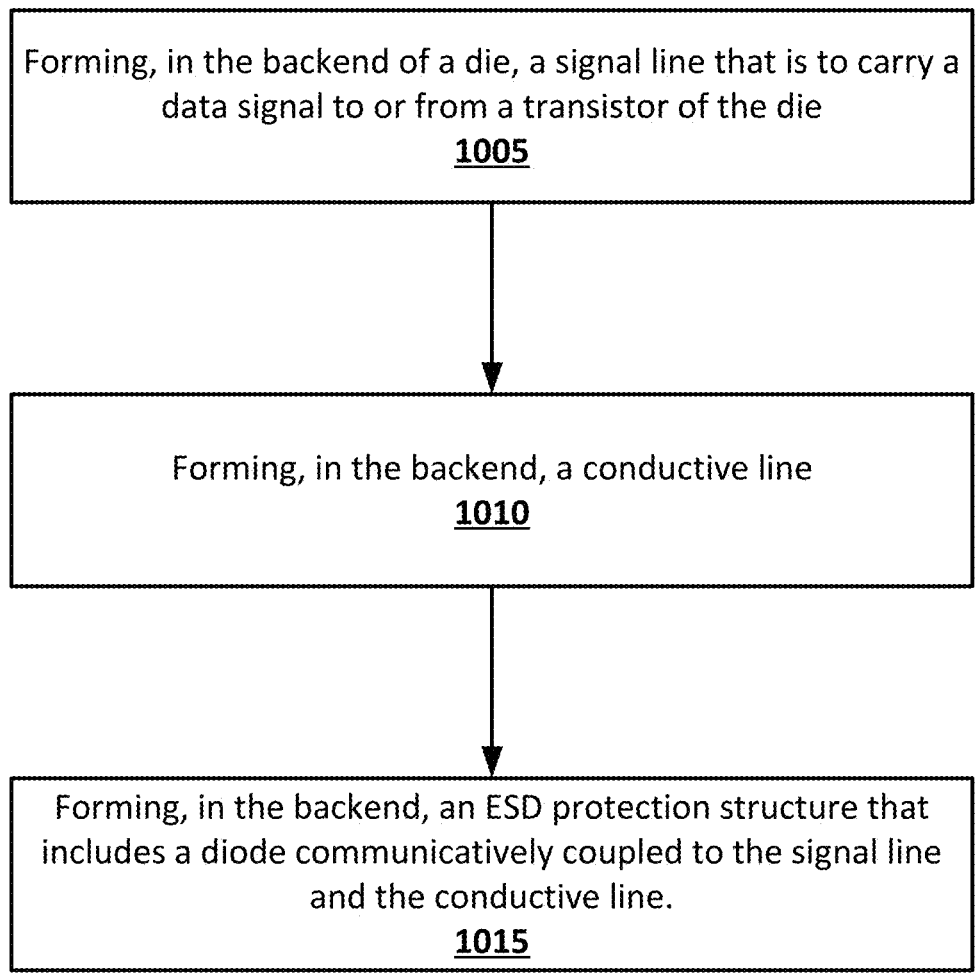
FIG. 10 depicts an example technique for the manufacture of a diode-based ESD protection structure, in accordance with various embodiments.

FIG. 10 depicts an example technique for the manufacture of a backend with a diode-based ESD protection structure, in accordance with various embodiments. Generally, FIG. 10 may be described with reference to the embodiment of FIG. 3, however it will be understood that FIG. 10 may be applicable, in whole or in part, with or without modification, to other embodiments of the present disclosure.

The technique may include forming, at 1005, in the backend of a die, a signal line that is to carry a data signal to or from a transistor of the die. The backend may be similar to, for example, backend 310. The signal line may be similar to, for example, signal line 307. The transistor may be similar to, for example, an IC such as IC 105. Forming the signal line may be performed through a technique such as plating, lithographic deposition, or some other type of deposition technique.

The technique may further include forming, at 1010, in the backend, a conductive line. The conductive line may be similar to, for example, ground line 303. In other embodiments, the conductive line may be similar to, for example a power line such as power line 509. Similarly to element 1005, the formation of the conductive line may be performed through a technique such as plating, lithographic deposition, or some other type of deposition technique.

The technique may further include forming, at 1015, in the backend, an ESD protection structure that includes a diode communicatively coupled to the signal trace and the conductive trace. The diode may be similar to, for example, diode 355. In some embodiments, the diode may be preformed and positioned in the backend material of the backend of the die, for example on top of the ground line, and then additional backend material may be deposited around the diode. In some embodiments, deposition of the diode material may be achieved through various techniques such as sputter deposition, physical vapor deposition (PVD), atomic layer deposition (ALD), vacuum evaporation, etc.

It will be understood that the above-described embodiment is an example embodiment, and other embodiments may vary from that depicted. For example, some embodiments may include additional steps (e.g., etching, annealing, etc.) In some embodiments, certain elements may be performed in an order that is different from that depicted in FIG. 10. For example, element 1010 may be performed prior to, or at the same time as, element 1005. In some embodiments, element 1015 may be performed prior to, or at the same time as, element 1010. Other variations may be present in other embodiments.

Figure 11:
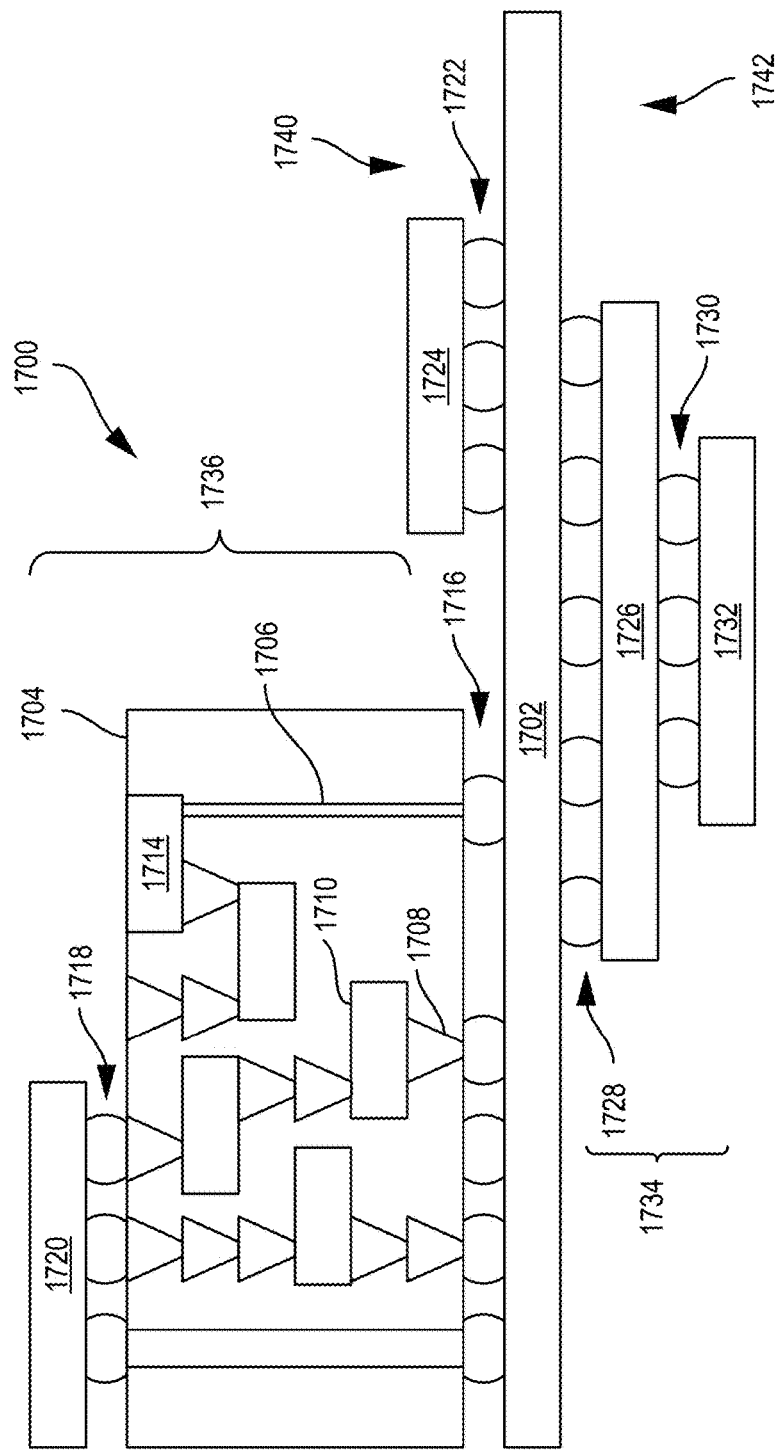
FIG. 11 is a side, cross-sectional view of an IC device assembly that may include a die with a backend diode-based ESD protection structure, in accordance with various embodiments.

FIG. 11 is a side, cross-sectional view of an IC device assembly 1700 that may include one or more IC packages or other electronic components (e.g., a die) that is or includes a die with a backend that has a diode-based ESD protection structure, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 11 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 11), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 11, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die, an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 11, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include a diode-based ESD protection structure.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 11 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 12:
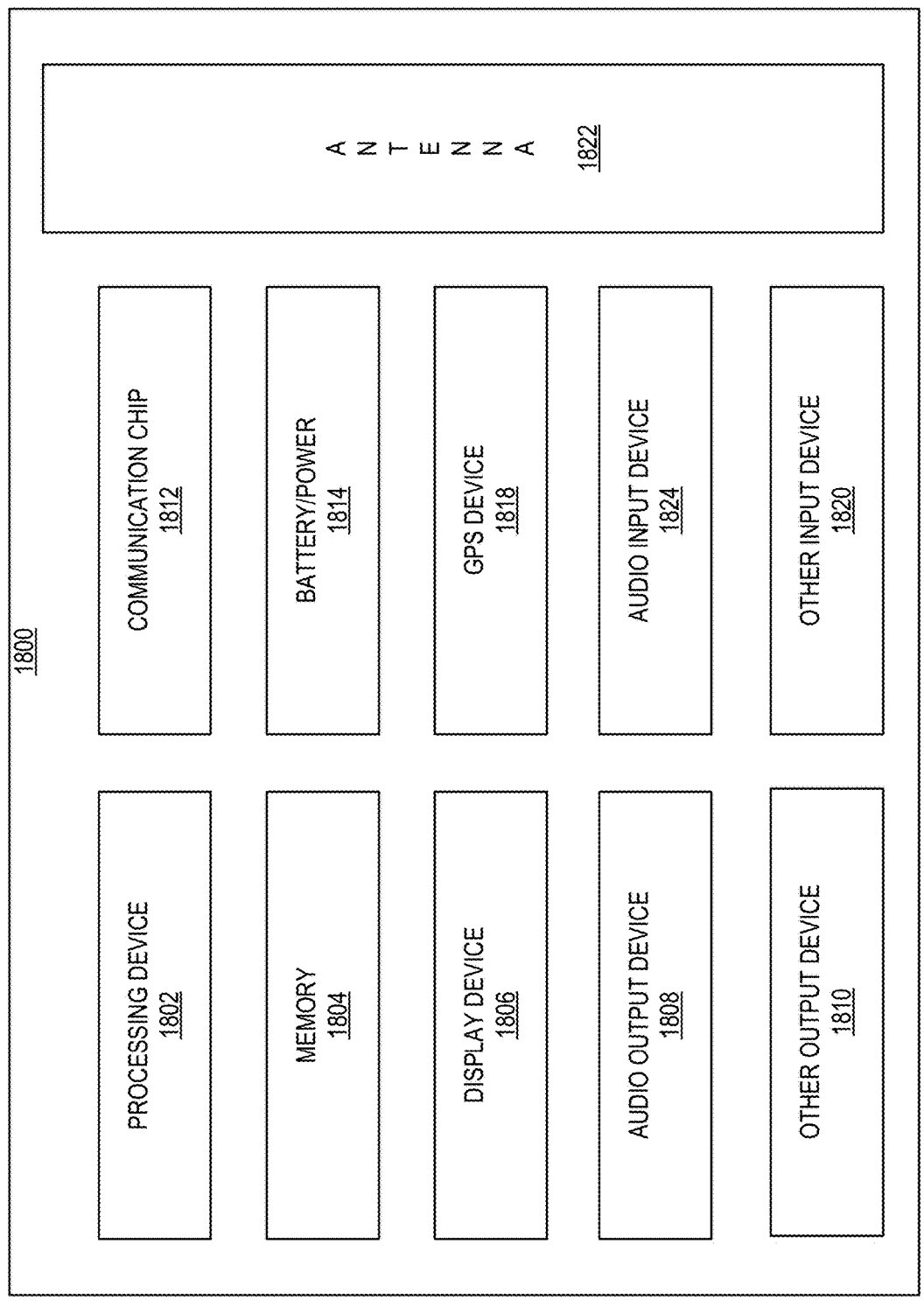
FIG. 12 is a block diagram of an example electrical device that may include a die with a backend diode-based ESD protection structure, in accordance with various embodiments.

FIG. 12 is a block diagram of an example electrical device 1800 that may include one or more des with a diode-based ESD protection structure in the backend, in accordance with any of the embodiments disclosed herein. For example, any suitable ones of the components of the electrical device 1800 may include one or more of the IC device assemblies 1700, IC packages, IC devices, or dies disclosed herein. A number of components are illustrated in FIG. 12 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 12, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), CPUs, graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Examples of Various Embodiments

Example 1 includes a die comprising: a front-end that includes a transistor; and a backend coupled with the front-end, wherein the backend includes: a signal line that is communicatively coupled with the transistor, and wherein the signal line is to convey data signals to and from the transistor; a conductive line; and a diode communicatively coupled with the signal line and the conductive line.

Example 2 includes the die of example 1, wherein the diode is to allow for charge to pass between the signal line and the conductive line based on a voltage threshold related to a voltage difference between the signal line and the conductive line.

Example 3 includes the die of example 1, wherein the conductive line is a ground line or a power line.

Example 4 includes the die of any of examples 1-3, wherein the diode is a Schottky diode that includes a Schottky contact, an ohmic contact, and a semiconductor material positioned between the Schottky and the ohmic contact.

Example 5 includes the die of example 4, wherein the semiconductor material is an oxide-based semiconductor material.

Example 6 includes the die of any of examples 1-3, wherein the diode is a pn-junction diode that includes a first ohmic contact coupled with the signal line, a second ohmic contact coupled with the conductive line, an n-type semiconductor material, and a p-type semiconductor material, wherein the n-type and p-type semiconductor materials are between the first and second ohmic contacts.

Example 7 includes the die of any of examples 1-3, wherein the backend further includes: a second conductive line; and a second diode communicatively coupled with the signal line and the second conductive line.

Example 8 includes a die for use in a microelectronic package, wherein the die comprises: a front-end that includes a transistor; and a backend coupled with the front-end, wherein the backend includes: a signal line communicatively coupled with the die; a ground line; a first diode communicatively coupled with the signal line and the ground line, wherein the first diode includes an ohmic contact, a Schottky contact, and a semiconductor material coupled with the Schottky and ohmic contacts; and a second diode communicatively coupled with the signal line and the ground line.

Example 9 includes the die of example 8, wherein the backend further includes a power line, and a third diode communicatively coupled with the signal line and the power line.

Example 10 includes the die of example 8, wherein the semiconductor material is an oxide-based semiconductor material.

Example 11 includes the die of example 8, wherein the semiconductor material is semiconductor material is gallium oxide ($Ga_2O_3$), indium oxide ($In_2O_3$), IGZO, or zinc oxide ($ZnO_2$).

Example 12 includes the die of any of examples 8-11, wherein ohmic contact includes molybdenum, copper, aluminum, titanium, or gold.

Example 13 includes the die of any of examples 8-11, wherein the Schottky contact includes lead, TiN, gold, platinum, or nickel.

Example 14 includes the die of any of examples 8-11, wherein the ohmic contact is coupled with the signal line and the Schottky contact is coupled with the ground line.

Example 15 includes the die of any of examples 8-11, wherein the ohmic contact is coupled with the ground line and the Schottky contact is coupled with the signal line.

Example 16 includes a method of forming an electrostatic discharge (ESD) protection structure in a backend of a die, wherein the method comprises: forming, in the backend, a signal line that is to carry a data signal to or from a transistor of the die; forming, in the backend, a conductive line; and forming, in the backend, the electrostatic discharge (ESD) protection structure that includes a diode communicatively coupled to the signal line and the conductive line.

Example 17 includes the method of example 16, wherein the conductive line is to couple with ground.

Example 18 includes the method of examples 16 or 17, further comprising: forming, in the backend, a second conductive line; and forming, in the backend, a second diode communicatively coupled to the signal line and the second conductive line.

Example 19 includes the method of example 18, wherein forming the second conductive line includes forming the second conductive line in a same layer of the backend as the signal line.

Example 20 includes the method of example 18, wherein forming the second conductive line includes forming the second conductive line in a different layer of the backend than the signal line.

Example 21 includes a microelectronic package comprising: a package substrate; and a die coupled with the package substrate, wherein the die includes: a signal line in a backend of the die; a conductive line in the backend of the die; and a diode communicatively coupled with the signal line and the conductive line.

Example 22 includes the microelectronic package of example 21, wherein the diode is to become conductive based on a voltage difference between the signal line and the conductive line.

Example 23 includes the microelectronic package of example 21, wherein the conductive line is a ground line or a power line.

Example 24 includes the microelectronic package of any of examples 21-23, wherein the diode is a Schottky diode.

Example 25 includes the microelectronic package of any of examples 21-23, wherein the die further comprises a second conductive line in the backend of the die, and a second diode communicatively coupled with the signal line and the second conductive line.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A die comprising:
a front-end that includes a transistor; and
a backend coupled with the front-end, wherein the backend includes:
a signal line that is communicatively coupled with the transistor, and wherein the signal line is to convey data signals to and from the transistor;
a conductive line; and
a diode communicatively coupled with the signal line and the conductive line, wherein:
the diode includes a first contact, a second contact, and at least one semiconductor material between the first contact and the second contact.

2. The die of claim 1, wherein the diode is to allow for charge to pass between the signal line and the conductive line based on a voltage threshold related to a voltage difference between the signal line and the conductive line.

3. The die of claim 1, wherein the conductive line is a ground line or a power line.

4. The die of claim 1, wherein the diode is a Schottky diode, the first contact is a Schottky contact, and the second contact is an ohmic contact.

5. The die of claim 4, wherein the semiconductor material is an oxide-based semiconductor material.

6. The die of claim 1, wherein the diode is a pn-junction diode, the first contact is a first ohmic contact, the second contact is a second ohmic contact, and the at least one semiconductor material is an n-type semiconductor material, and the diode further comprises a p-type semiconductor material between the first and second ohmic contacts.

7. The die of claim 1, wherein the backend further includes:
a second conductive line; and
a second diode communicatively coupled with the signal line and the second conductive line.

8. A microelectronic package comprising:
a package substrate; and
a die coupled with the package substrate, wherein the die includes:
a signal line in a backend of the die;
a conductive line in the backend of the die; and
a diode in the backend of the die communicatively coupled with the signal line and the conductive line, wherein:
the diode includes a first contact, a second contact, and at least one semiconductor material positioned between the first contact and the second contact.

9. The microelectronic package of claim 8, wherein the diode is to become conductive based on a voltage difference between the signal line and the conductive line.

10. The microelectronic package of claim 8, wherein the conductive line is a ground line or a power line.

11. The microelectronic package of claim 8, wherein the diode is a Schottky diode.

12. The microelectronic package of claim 8, wherein the die further comprises a second conductive line in the backend of the die, and a second diode communicatively coupled with the signal line and the second conductive line.

\* \* \* \* \*